US011568912B2

(12) United States Patent
Young et al.

(10) Patent No.: US 11,568,912 B2
(45) Date of Patent: Jan. 31, 2023

(54) MEMORY CELL AND METHOD OF OPERATING THE SAME

(71) Applicant: TAIWAN SEMICONDUCTOR MANUFACTURING COMPANY, LTD., Hsinchu (TW)

(72) Inventors: Bo-Feng Young, Hsinchu (TW); Sai-Hooi Yeong, Hsinchu (TW); Chao-I Wu, Hsinchu (TW); Chih-Yu Chang, Hsinchu (TW); Yu-Ming Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/196,131

(22) Filed: Mar. 9, 2021

(65) Prior Publication Data

US 2021/0375344 A1 Dec. 2, 2021

Related U.S. Application Data

(60) Provisional application No. 63/031,851, filed on May 29, 2020.

(51) Int. Cl.
*G11C 11/22* (2006.01)
*H01L 27/1159* (2017.01)

(52) U.S. Cl.
CPC ........ *G11C 11/223* (2013.01); *G11C 11/2273* (2013.01); *G11C 11/2275* (2013.01); *H01L 27/1159* (2013.01)

(58) Field of Classification Search
CPC ............ G11C 11/223; G11C 11/2273; G11C 11/2275; G11C 11/2259; H01L 27/1159

USPC .......................................................... 365/145
See application file for complete search history.

(56) References Cited

U.S. PATENT DOCUMENTS

| 2004/0129987 | A1  | 7/2004  | Uchiyama et al. |
| 2008/0037349 | A1  | 2/2008  | Stipe |
| 2012/0314476 | A1* | 12/2012 | Appenzeller ..... H01L 29/78391 257/295 |
| 2018/0366476 | A1* | 12/2018 | Liu .................... H01L 21/02194 |
| 2019/0371802 | A1* | 12/2019 | Morris .................... H01L 28/60 |

(Continued)

FOREIGN PATENT DOCUMENTS

| CN | 110415744 B | * | 4/2021 | ......... G11C 11/2255 |
| EP | 3506265 A1 | * | 7/2019 | ............. G11C 11/22 |

(Continued)

OTHER PUBLICATIONS

Review and Classification of Gain Cell eDRAM Implementations, Teman et al., all pages. (Year: 2012).*

(Continued)

*Primary Examiner* — Fernando Hidalgo
(74) *Attorney, Agent, or Firm* — Hauptman Ham, LLP

(57) ABSTRACT

A memory cell includes a write bit line, a write transistor and a read transistor. The write transistor is coupled between the write bit line and a first node. The read transistor is coupled to the write transistor by the first node. The read transistor includes a ferroelectric layer. The write transistor is configured to set a stored data value of the memory cell by a write bit line signal that adjusts a polarization state of the read transistor. The polarization state corresponds to the stored data value.

20 Claims, 13 Drawing Sheets

(56) References Cited

U.S. PATENT DOCUMENTS

2020/0357453 A1* 11/2020 Slesazeck ........... G11C 11/2275
2021/0036024 A1*  2/2021 Kim ................... H01L 27/0922
2021/0210496 A1*  7/2021 Chia ..................... H01L 28/90

FOREIGN PATENT DOCUMENTS

KR        20180013861         2/2018
WO         2016190880        12/2016
WO    WO-2016190880 A1 *  12/2016   ........... G11C 11/221

OTHER PUBLICATIONS

Teman, Adam, et al. "Review and classification of gain cell eDRAM implementations." 2012 IEEE 27th Convention of Electrical and Electronics Engineers in Israel. IEEE, 2012.

Juejian Wu et al., Adaptive circuit approaches to low-power multi-level/cell FeFET Memory, 2020 IEEE, KIPO, Downloaded on Oct. 6, 2022 from IEEE Xplore, pp. 407-413.

Amit Kazimirsky et al., Opportunistic refreshing algorithm for eDRAM memories, IEEE Transactions on Circuits and Systems—1: Regular Papers, vol. 63, No. 11, Nov. 2016, pp. 1921-1932.

* cited by examiner

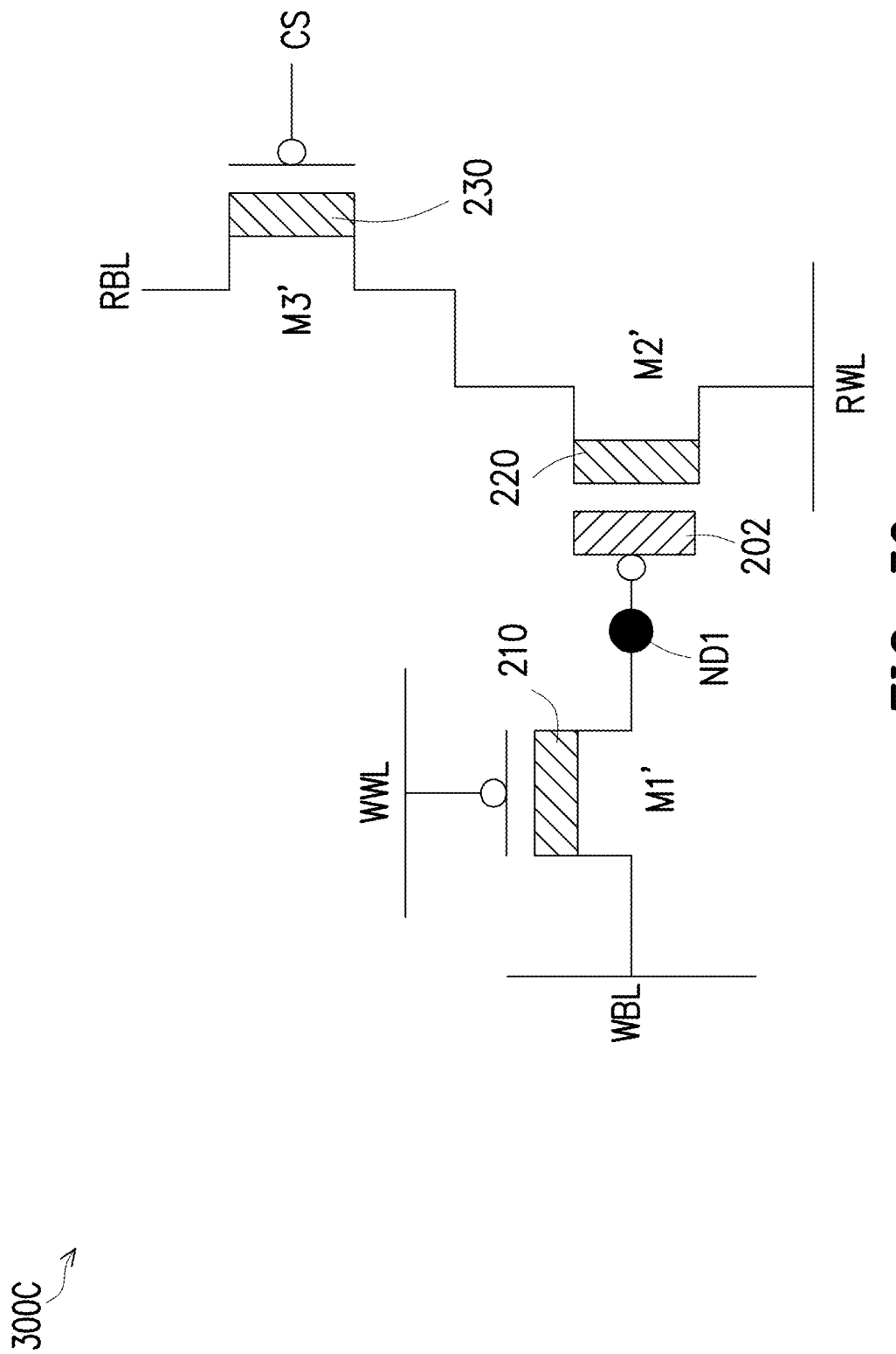

MEMORY CELL AND METHOD OF OPERATING THE SAME

PRIORITY CLAIM

This application claims the benefit of U.S. Provisional Application No. 63/031,851, filed May 29, 2020, which is herein incorporated by reference in its entirety.

BACKGROUND

The semiconductor integrated circuit (IC) industry has produced a wide variety of digital devices to address issues in a number of different areas. Some of these digital devices, such as memory macros, are configured for the storage of data. As ICs have become smaller and more complex, the resistance of conductive lines within these digital devices are also changed affecting the operating voltages of these digital devices and overall IC performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3C is a circuit diagram of a memory cell, in accordance with some embodiments.

DETAILED DESCRIPTION

Figure 1:
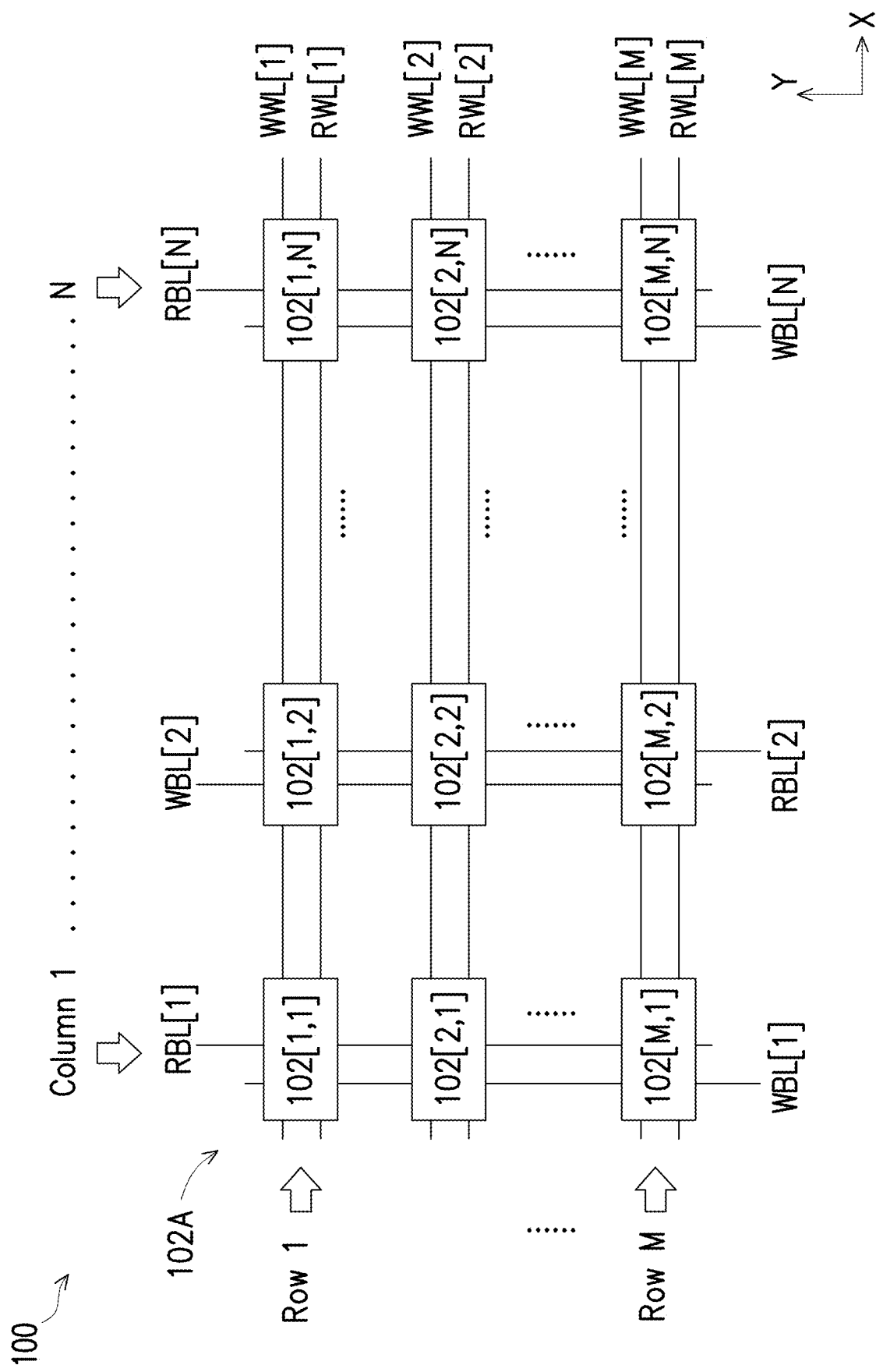
FIG. 1 is a block diagram of a memory cell array, in accordance with some embodiments.

The following disclosure provides different embodiments, or examples, for implementing features of the provided subject matter. Specific examples of components, materials, values, steps, arrangements, or the like, are described below to simplify the present disclosure. These are, of course, merely examples and are not limiting. Other components, materials, values, steps, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a memory cell includes a write bit line, a write transistor and a read transistor. The write transistor is coupled between the write bit line and a first node. The read transistor is coupled to the write transistor by the first node. The write transistor is configured to set a stored data value of the memory cell by a write bit line signal that adjusts a polarization state of the read transistor. In some embodiments, the polarization state corresponds to the stored data value of the memory cell.

In some embodiments, the read transistor includes a first gate terminal coupled to the write transistor by the first node, and a ferroelectric region having the polarization state that corresponds to the stored data value of the memory cell.

In some embodiments, by using the ferroelectric region in the memory cell, the memory cell has less charge leakage at the first node compared to other approaches. In some embodiments, by using the ferroelectric region in the memory cell, the ferroelectric region is able to hold or maintain the polarization state even after voltage at the first node is removed thereby resulting in the memory cell having a longer data retention time and a larger memory window than other approaches. In some embodiments, by having at least a longer data retention time or a larger memory window than other approaches, the memory cell is refreshed less than other approaches resulting in less power consumption than other approaches.

FIG. 1 is a block diagram of a memory cell array 100, in accordance with some embodiments. In some embodiments, memory cell array 100 is part of an integrated circuit.

Memory cell array 100 comprises an array of memory cells 102[1,1], 102[1,2], . . . , 102[2,2], . . . , 102[M,N] (collectively referred to as "array of memory cells 102A") having M rows and N columns, where N is a positive integer corresponding to the number of columns in array of memory cells 102A and M is a positive integer corresponding to the number of rows in array of memory cells 102A. The rows of cells in array of memory cells 102A are arranged in a first direction X. The columns of cells in array of memory cells 102A are arranged in a second direction Y. The second direction Y is different from the first direction X. In some embodiments, the second direction Y is perpendicular to the first direction X. Each memory cell 102[1,1], 102[1,2], . . . , 102[2,2], . . . , 102[M,N] in array of memory cells 102A is configured to store a corresponding bit of data.

Figure 2A:
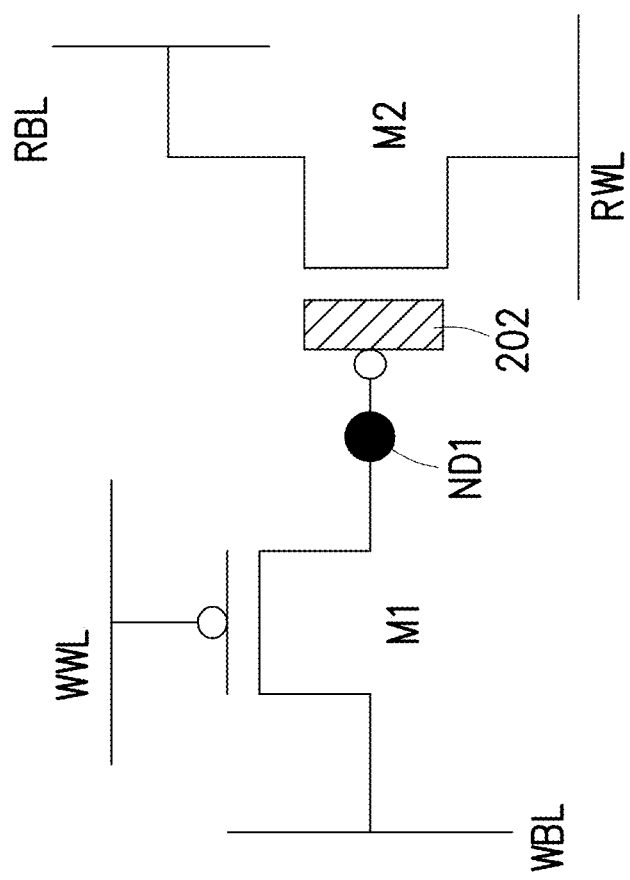
FIG. 2A is a circuit diagram of a memory cell, in accordance with some embodiments.
Figure 2B:
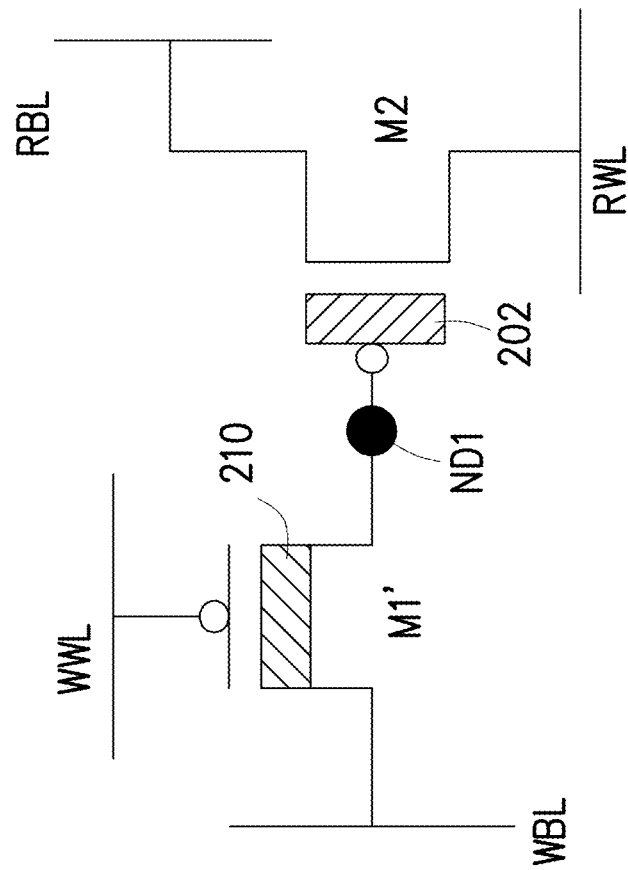
FIG. 2B is a circuit diagram of a memory cell, in accordance with some embodiments.
Figure 2C:
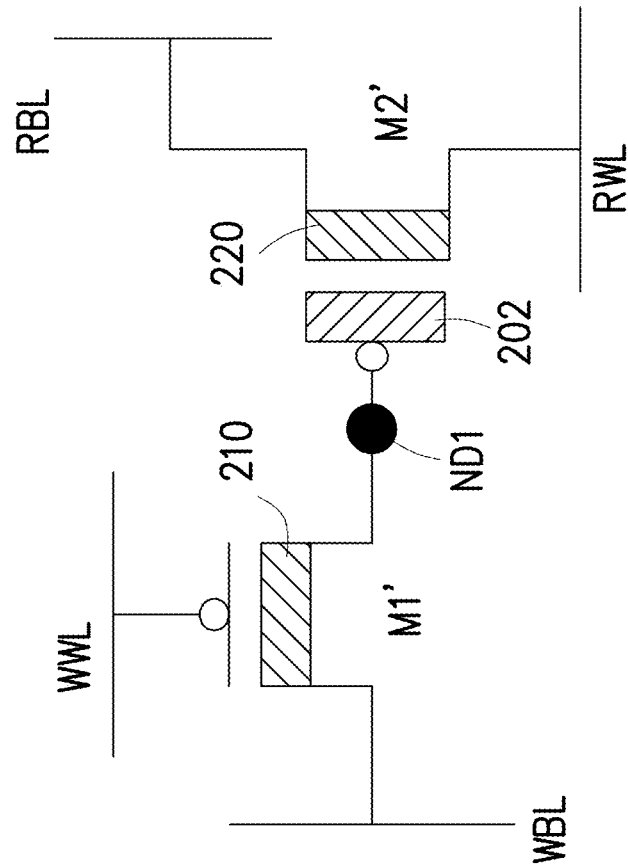
FIG. 2C is a circuit diagram of a memory cell, in accordance with some embodiments.
Figure 3A:
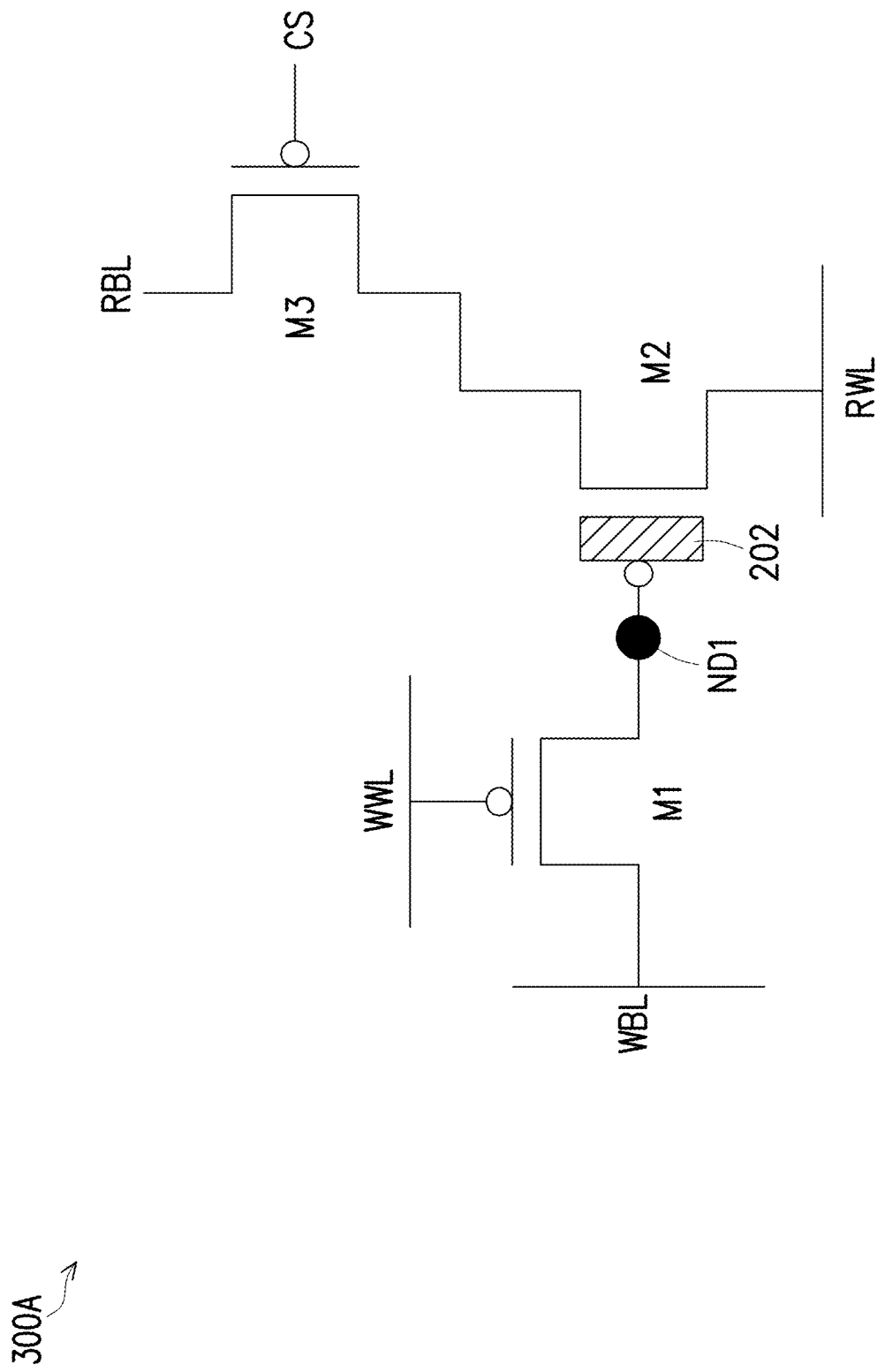
FIG. 3A is a circuit diagram of a memory cell, in accordance with some embodiments.
Figure 3B:
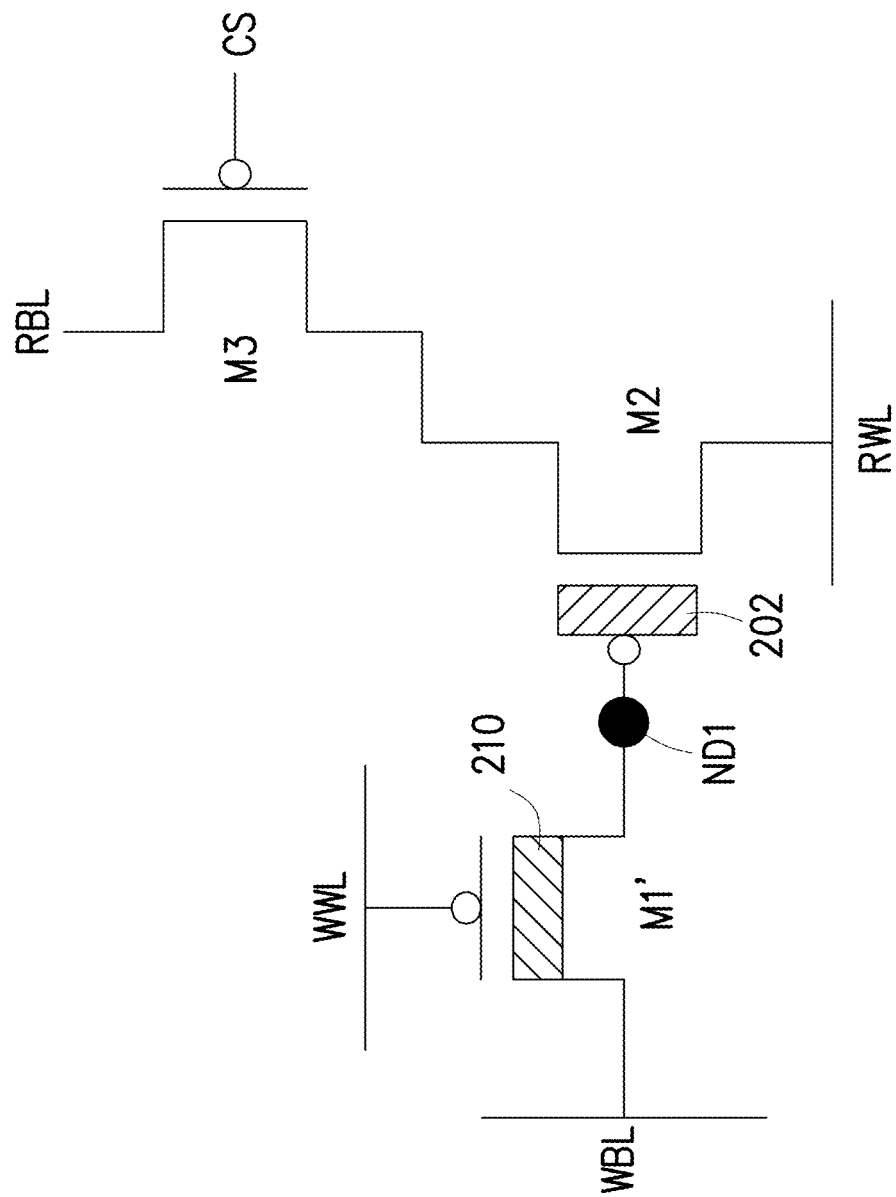
FIG. 3B is a circuit diagram of a memory cell, in accordance with some embodiments.
Figure 4A:
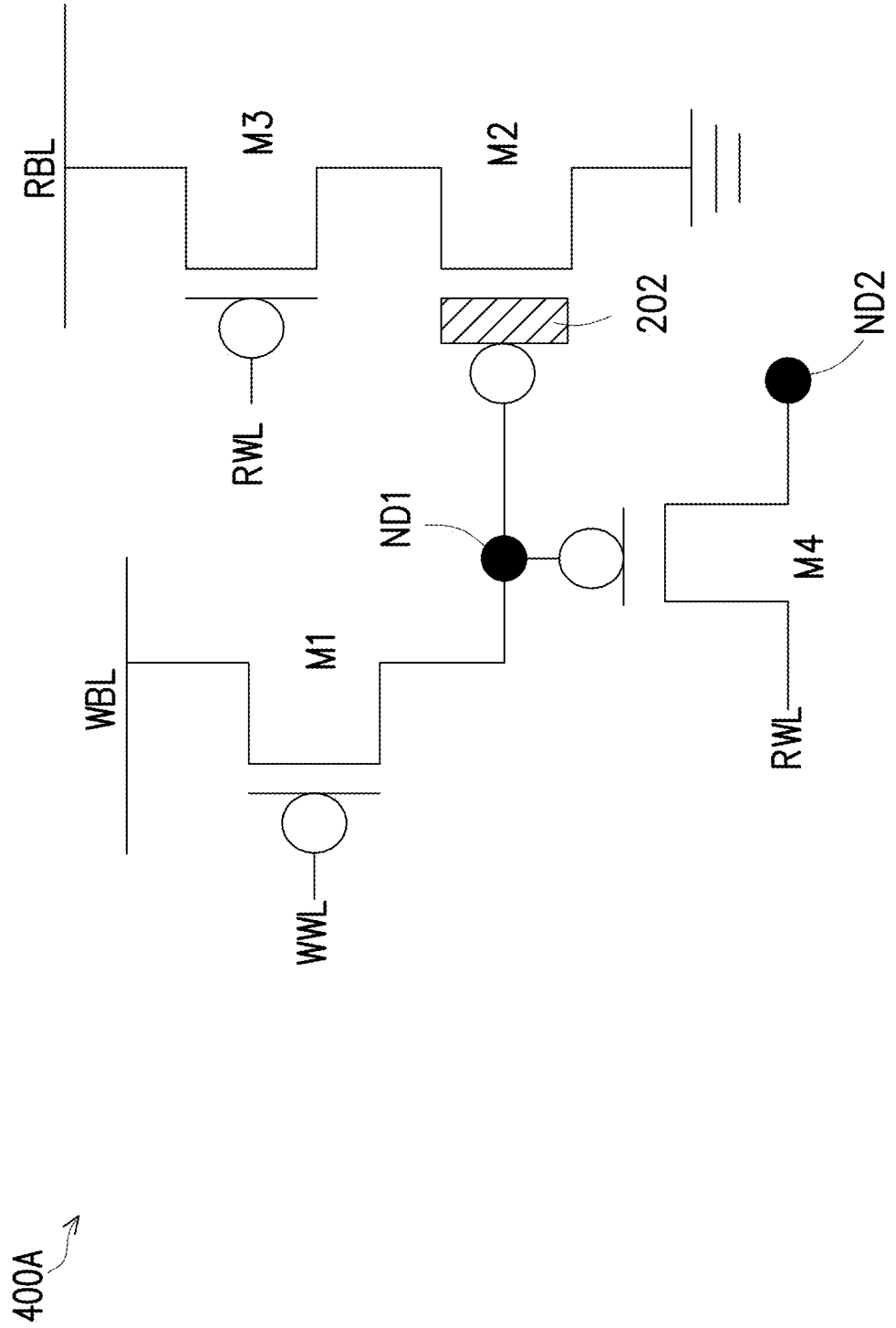
FIG. 4A is a circuit diagram of a memory cell, in accordance with some embodiments.
Figure 4B:
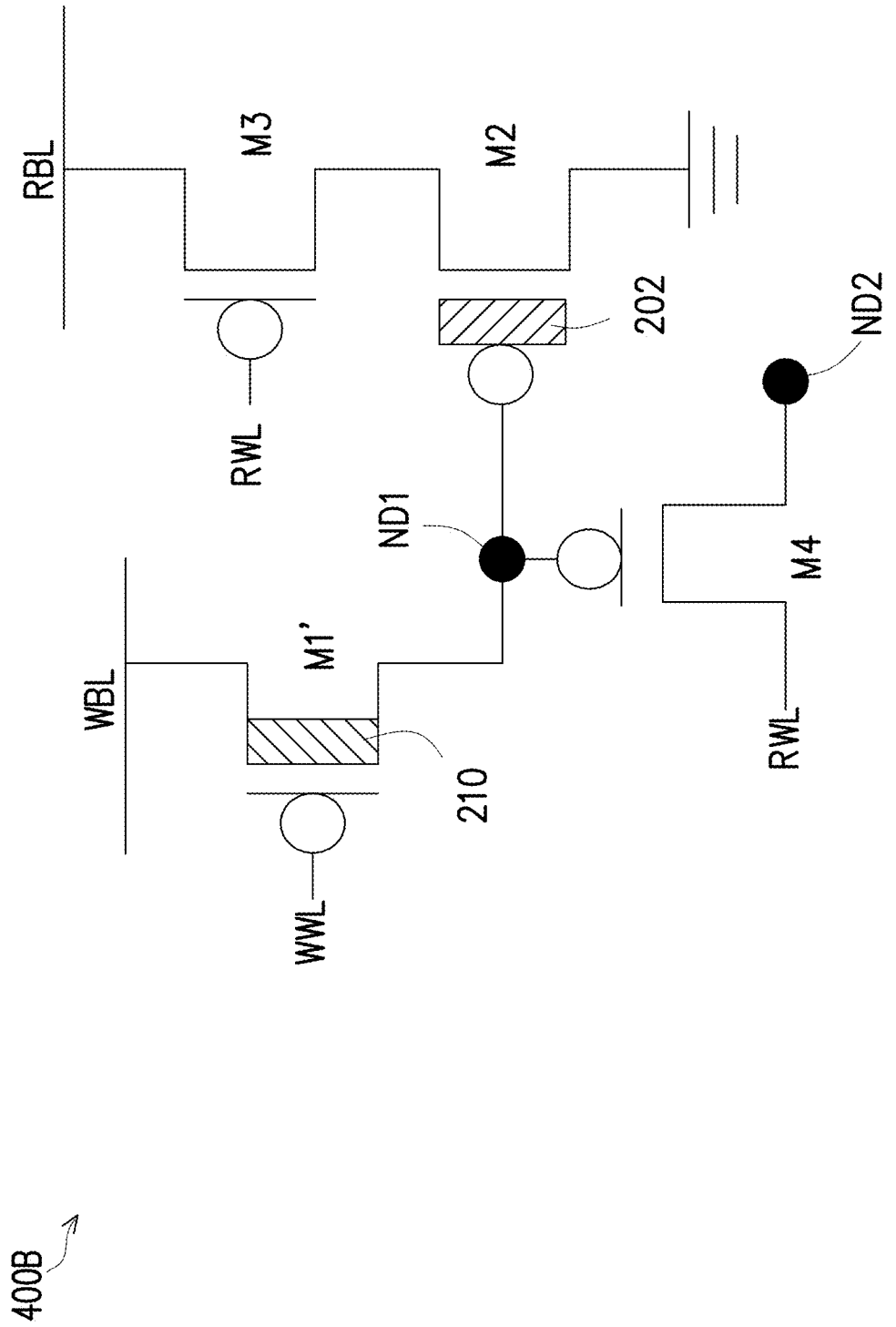
FIG. 4B is a circuit diagram of a memory cell, in accordance with some embodiments.
Figure 4C:
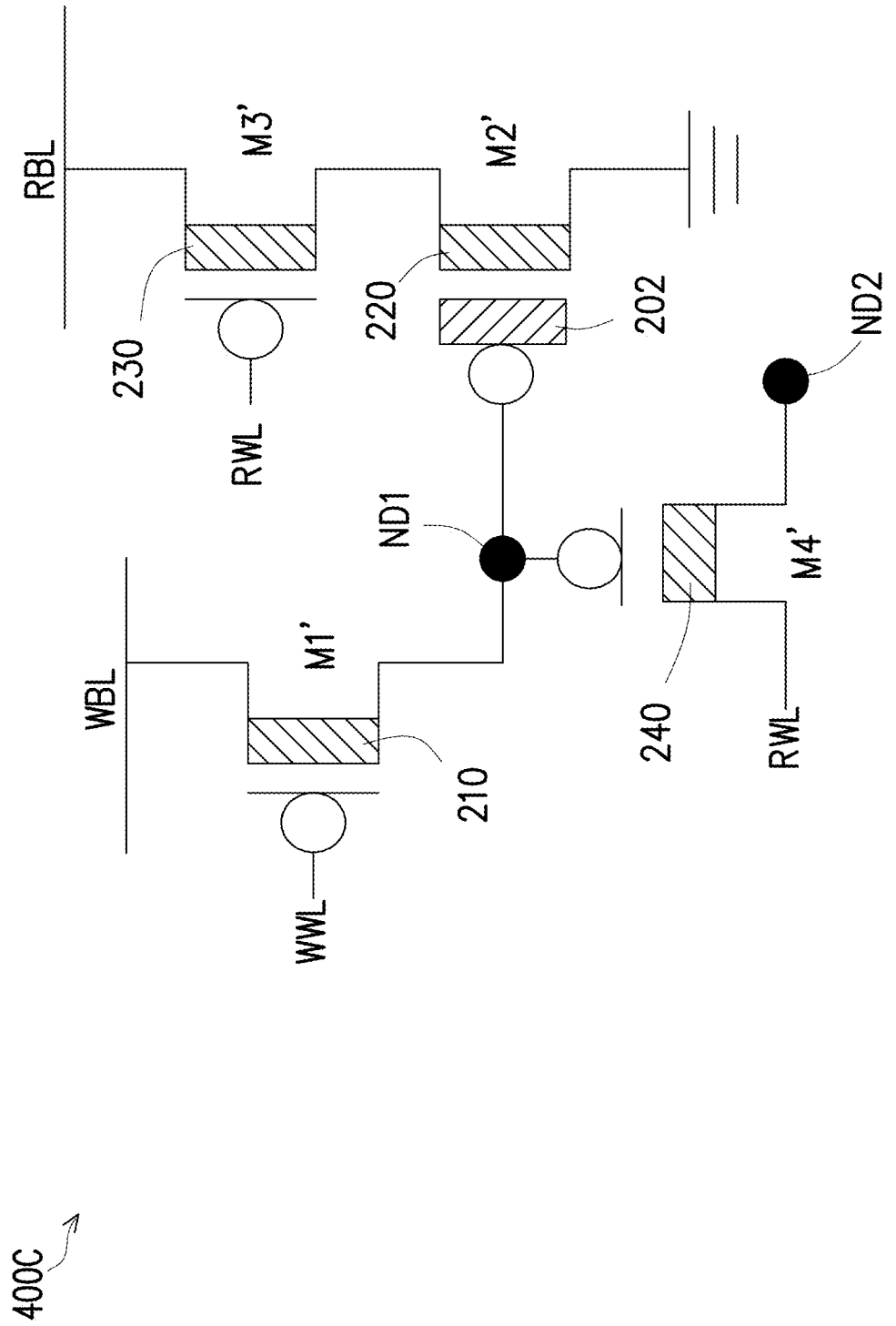
FIG. 4C is a circuit diagram of a memory cell, in accordance with some embodiments.

Array of memory cells 102A is a dynamic random-access memory (DRAM) array including DRAM-like memory cells. In some embodiments, each memory cell in array of memory cells 102A corresponds to a two transistor (2T) memory cell with 1-Ferroelectric field effect transistor (FeFET) as shown in FIGS. 2A-2C. In some embodiments, each memory cell in array of memory cells 102A corresponds to a three transistor (3T) memory cell with 1-FeFET as shown in FIGS. 3A-3C. In some embodiments, each memory cell in array of memory cells 102A corresponds to a four transistor (4T) memory cell with 1-FeFET as shown in FIGS. 4A-4C.

Different types of memory cells in array of memory cells 102A are within the contemplated scope of the present disclosure. For example, in some embodiments, each memory cell in array of memory cells 102A is a static random access memory (SRAM). In some embodiments, each memory cell in array of memory cells 102A corresponds to a ferroelectric resistive random-access memory (FeRAM) cell. In some embodiments, each memory cell in array of memory cells 102A corresponds to a magneto-resistive random-access memory (MRAM) cell. In some embodiments, each memory cell in array of memory cells 102A corresponds to a resistive random-access memory (RRAM) cell. Other configurations of array of memory cells 102A are within the scope of the present disclosure.

Memory cell array 100 further includes M write word lines WWL[1], ... WWL[M] (collectively referred to as "write word line WWL"). Each row 1, ..., M in array of memory cells 102A is associated with a corresponding write word line WWL[1], ..., WWL[M]. Each row of memory cells in array of memory cells 102A is coupled with a corresponding write word line WWL[1], ..., WWL[M]. For example, memory cells 102[1,1], 102[1,2], ..., 102[1,N] in row 1 are coupled with write word line WWL[1]. Each write word line WWL extends in the first direction X.

Memory cell array 100 further includes M read word lines RWL[1], ... RWL[M] (collectively referred to as "read word line RWL"). Each row 1, ..., M in array of memory cells 102A is associated with a corresponding read word line RWL[1], ..., RWL[M]. Each row of memory cells in array of memory cells 102A is coupled with a corresponding read word line RWL[1], ..., RWL[M]. For example, memory cells 102[1,1], 102[1,2], ..., 102[1,N] in row 1 are coupled with read word line RWL[1]. Each read word line RWL extends in the first direction X.

Memory cell array 100 further includes N write bit lines WBL[1], ... WBL[N] (collectively referred to as "write bit line WBL"). Each column 1, ..., N in array of memory cells 102A is associated with a corresponding write bit line WBL[1], ..., WBL[N]. Each column of memory cells in array of memory cells 102A is coupled with a corresponding write bit line WBL[1], ..., WBL[N]. For example, memory cells 102[1,1], 102[2,1], ..., 102[M,1] in column 1 are coupled with write bit line WBL[1]. Each write bit line WBL extends in the second direction Y.

Memory cell array 100 further includes N read bit lines RBL[1], ... RBL[N] (collectively referred to as "read bit line RBL"). Each column 1, ..., N in array of memory cells 102A is associated with a corresponding read bit line RBL[1], ..., RBL[N]. Each column of memory cells in array of memory cells 102A is coupled with a corresponding read bit line RBL[1], ..., RBL[N]. For example, memory cells 102[1,1], 102[2,1], ..., 102[M,1] in column 1 are coupled with read bit line RBL[1]. Each read bit line RBL extends in the second direction Y.

Other configurations of memory cell array 100 are within the scope of the present disclosure. Different configurations of at least write bit lines BL, write word lines WWL, read bit lines RBL or read word lines RWL in memory cell array 100 are within the contemplated scope of the present disclosure. In some embodiments, memory cell array 100 includes additional write ports (write word lines WWL or write bit lines WBL) and/or read ports (read word lines RWL or read bit lines RBL). Furthermore, in some embodiments, array of memory cells 102A includes multiple groups of different types of memory cells.

By way of an illustrative example, a write operation is performed to memory cell 102[1,1] located in row 1 and column 1 of array of memory cells 102A. Row 1 includes memory cells 102[1,1], 102[1,2], ..., 102[1,N] that are selected by write word line WWL[1]. Column 1 includes memory cells 102[1,1], 102[2,1], ..., 102[M,1] that are selected for receiving a data signal and storing a binary bit of data by write bit line WBL[1]. Together, write word line WWL[1] and write bit line WBL[1] select and store a binary bit of data in memory cell 102[1,1].

By way of an illustrative example, a read operation is performed to memory cell 102[1,1] located in row 1 and column 1 of array of memory cells 102A. Row 1 includes memory cells 102[1,1], 102[1,2], ..., 102[1,N] that are selected by read word line RWL[1]. Column 1 includes memory cells 102[1,1], 102[2,1], ..., 102[M,1] that are selected to access the stored binary bit of data by read bit line RBL[1]. Together, read word line RWL[1] and read bit line RBL[1] select and read the binary bit of data stored in memory cell 102[1,1].

FIG. 2A is a circuit diagram of a memory cell 200A, in accordance with some embodiments.

Memory cell 200A is an embodiment of a memory cell in array of memory cells 102A of FIG. 1 expressed in a schematic diagram, and similar detailed description is therefore omitted.

Components that are the same or similar to those in one or more of FIGS. 2A-2C, 3A-3C, 4A-4C (shown below) are given the same reference numbers, and detailed description thereof is thus omitted. For ease of illustration, some of the labeled elements of FIGS. 2A-2C, 3A-3C, 4A-4C are not labelled in each of FIGS. 2A-2C, 3A-3C, 4A-4C. In some embodiments, FIGS. 2A-2C, 3A-3C, 4A-4C include additional elements not shown in FIGS. 2A-2C, 3A-3C, 4A-4C.

Memory cell 200A is usable as one or more memory cells in array of memory cells 102A of FIG. 1.

Memory cell 200A includes a write transistor M1, a read transistor M2, a write word line WWL, a read word line RWL, a write bit line WBL and a read bit line RBL.

Write word line WWL corresponds to a write word line of write word lines WWL[1], ..., WWL[M], read word line RWL corresponds to a read word line of read word lines RWL[1], ..., RWL[M], write bit line WBL corresponds to a write bit line of write bit lines WBL[1], ..., WBL[N], and read bit line RBL corresponds to a read bit line of read bit lines RBL[1], ..., RBL[N] of FIG. 1, and similar detailed description is therefore omitted.

Write transistor M1 includes a gate terminal coupled to write word line WWL, a drain terminal coupled to write bit line WBL, and a source terminal coupled to at least a gate terminal of read transistor M2 by a node ND1. Write transistor M1 is configured to write data in memory cell 200A. Write transistor M1 is enabled (e.g., turned on) or disabled (e.g., turned off) in response to a write bit line signal on the write bit line WBL.

Write transistor M1 is shown as a P-type Metal Oxide Semiconductor (PMOS) transistor. In some embodiments, write transistor M1 is an N-type Metal Oxide Semiconductor (NMOS) transistor.

Read transistor M2 includes a drain terminal coupled to read word line RWL, a source terminal coupled to read bit line RBL, and a gate terminal coupled to the source terminal of write transistor M1.

Read transistor M2 is referred to as a ferroelectric field effect transistor (FeFET) device, as read transistor M2 includes a ferroelectric region 202 positioned within the gate terminal of the read transistor M2. The ferroelectric region 202 is configured to have different polarization states based on the voltage applied to the gate of the read transistor M2. The polarization of the ferroelectric region 202 determines the conductivity (e.g., low resistance state or high resistance state) of read transistor M2 which represents the data stored in read transistor M2.

Data is stored by programming the ferroelectric region 202 to have different polarization states. The different polarization states create two different threshold voltage states (e.g., Vth) that correspond to a logic '1' and a logic '0'. Due to the threshold voltage difference, the ferroelectric region 202 in the read transistor M2 is configured to use specific gate voltages based on its logic state to turn on. In some embodiments, the difference between these gate voltages is referred to as memory window.

The binary states of stored data in memory cell 200A are encoded in the form of the polarization of the ferroelectric region 202. The direction or value of the polarization (e.g., +P or −P) of the ferroelectric region 202 determines the resistance state (e.g., low or high) of the read transistor M2. In some embodiments, a low resistance state of the read transistor M2 corresponds to the read transistor M2 being turned on or conducting, and a high resistance state of the read transistor M2 corresponds to the read transistor M2 being turned off or not conducting. In some embodiments, a low resistance state of the read transistor M2 corresponds to a first stored value (e.g., logic "0" or "1"), and a high resistance state of the read transistor M2 corresponds to a second stored value (e.g., logic "1" or "0") opposite from the first stored value. A voltage of the gate of the read transistor M2 or node ND1 controls the polarization states and corresponding electric field in the ferroelectric region 202 of read transistor M2.

Write transistor M1 is configured to write data by controlling the voltage of node ND1 or the gate of read transistor M2 thereby controlling the polarization states of the ferroelectric region 202 of read transistor M2. In some embodiments, if the write transistor M1 is enabled or turned on, a voltage of the write bit line WBL is configured to control the voltage of the node ND1 or the gate of read transistor M2. Thus, in some embodiments, the polarized state of the ferroelectric region 202 is controlled by the voltage of the write bit line WBL. In some embodiments, the voltage of the write bit line WBL corresponds to the data stored in memory cell 200A. In some embodiments, the polarization state of the ferroelectric region 202 is maintained even after an electric field or a corresponding voltage at node ND1 is removed, and the read transistor M2 is a non-volatile transistor device.

Read transistor M2 is configured to read data stored in memory cell 200A. In some embodiments, read transistor M2 is configured to output data stored in memory cell 200A based on whether read transistor M2 is turned on or off. The polarization state of the ferroelectric region 202 determines whether read transistor M2 is turned on or off.

In some embodiments, write transistor M1 and read transistor M2 each include channel regions that are formed of a same type of material. In some embodiments, write transistor M1 and read transistor M2 each have channel regions that have a silicon body or bulk.

Read transistor M2 is shown as a PMOS transistor. In some embodiments, read transistor M2 is an NMOS transistor.

During a write operation of memory cell 200A, the voltage of the write bit line WBL (e.g., data to be stored in memory cell 200A) is set by a write driver circuit (not shown), and the write word line WWL is set to a logical low thereby turning on write transistor M1. In response to write transistor M1 being turned on, the voltage of the write bit line WBL is applied to the gate of read transistor M2 or node ND1. As the voltage of the write bit line WBL is applied to the gate of read transistor M2 or node ND1, the write bit line voltage controls the polarization state of the ferroelectric region 202 and the corresponding data stored by read transistor M2. In other words, the voltage of the write bit line WBL is used to set the read transistor M2 in a low resistance state (e.g., conducting) or a high resistance state (e.g., not conducting). Afterwards, the write word line WWL is set to a logical high thereby turning off write transistor M1.

In response to write transistor M1 being turned off, data stored in memory cell 200A is held, and memory cell 200A is in a hold mode.

By using ferroelectric region 202 in memory cell 200A, memory cell 200A does not have charge leakage at node ND1 compared to other approaches (such as DRAM). By using ferroelectric region 202 in memory cell 200A, the non-volatile nature of the ferroelectric material in ferroelectric region 202 is able to hold or maintain the polarization state even after the voltage at node ND1 is removed thereby resulting in a longer data retention time and a larger memory window than other approaches. By having at least a longer data retention time or a larger memory window than other approaches, memory cell 200A is refreshed less than other approaches resulting in less power consumption than other approaches.

In some embodiments, memory cell 200A and memory cells 200B-200C (FIGS. 2B-2C) have a 2T memory cell structure that is compatible with complementary metal oxide semiconductor (CMOS) processes and is therefore scalable.

During a read operation of memory cell 200A, the voltage of the read bit line RBL is pre-discharged to a logical low, and the read word line RWL is raised to a logical high. In some embodiments, if the read transistor M2 is in a low resistance state, then the read transistor M2 is turned on or conducting, and the current from the read word line RWL through the read transistor M2 to the read bit line RBL is sensed by a sense amplifier (not shown), and the data associated with the read transistor M2 being in a low resistance state (e.g., "1" or "0") is read out. In some embodiments, if the read transistor M2 is in a high resistance state, then the read transistor M2 is turned off or not conducting, and the current from the read word line RWL through the read transistor M2 to the read bit line RBL is sensed by a sense amplifier (not shown), and the data associated with the read transistor M2 being in a high resistance state (e.g., "0" or "1") is read out. In this embodiment, the current through the read transistor M2 is negligible since the read transistor M2 is turned off. Afterwards, the read word line RWL is set to a logical low.

Other transistor terminals for each of the transistors M1, M2, M1' or M2' (described below) of the present application are within the scope of the present disclosure. For example, reference to the drains and sources of a same transistor in the present disclosure can be changed to a source and a drain of the same transistor. Thus, for write transistor M1, reference to the drain and source of write transistor M1 can be changed to the source and drain of write transistor M1, respectively. Similarly, for read transistor M2, reference to the drain and source of read transistor M2 can be changed to the source and drain of read transistor M2, respectively.

Other configurations or quantities of transistors in memory cell 200A are within the scope of the present disclosure.

FIG. 2B is a circuit diagram of a memory cell 200B, in accordance with some embodiments.

Memory cell 200B is an embodiment of a memory cell in array of memory cells 102A of FIG. 1 expressed in a schematic diagram, and similar detailed description is therefore omitted.

Memory cell 200B is usable as one or more memory cells in array of memory cells 102A of FIG. 1. Memory cell 200B includes a write transistor M1', read transistor M2, write word line WWL, read word line RWL, write bit line WBL and read bit line RBL.

Memory cell 200B is a variation of memory cell 200A of FIG. 2A, and similar detailed description is therefore omitted. In comparison with memory cell 200A of FIG. 2A, write transistor M1' replaces write transistor M1 of FIG. 2A, and similar detailed description is therefore omitted.

Write transistor M1' is shown as a PMOS transistor. In some embodiments, write transistor M1' is an NMOS transistor. In some embodiments, write transistor M1' is similar to write transistor M1 of FIG. 2A, and similar detailed description is therefore omitted. The operation of memory cell 200B is similar to the operation of memory cell 200A described above, and similar detailed description is therefore omitted.

In comparison with write transistor M1 of FIG. 2A, write transistor M1' includes an oxide channel region 210, and similar detailed description is therefore omitted. In some embodiments, one or more transistors having oxide channel regions of the present disclosure include thin film transistors (TFTs). In some embodiments, the oxide channel region 210 for write transistor M1' includes an oxide semiconductor material including zinc oxide, cadmium oxide, indium oxide, IGZO, $SnO_2$, $TiO_2$, or combinations thereof, or the like. Other transistor types or oxide materials for write transistor M1' are within the scope of the present disclosure.

In some embodiments, by including write transistor M1' with an oxide channel region 210 and an FeFET read transistor M2, memory cell 200B has lower leakage current than other approaches that do not include an oxide channel region in the write transistor. In some embodiments, by reducing the leakage current of memory cell 200B, memory cell 200B has a longer data retention time than other approaches. By having a longer data retention time than other approaches, memory cell 200B is refreshed less than other approaches resulting in less power consumption than other approaches. In some embodiments, by reducing the leakage current of memory cell 200B, memory cell 200B has less write disturbance errors than other approaches. Furthermore, since memory cell 200B is similar to memory cell 200A, memory cell 200B also has the benefits discussed above with respect to memory cell 200A. In some embodiments, the oxide channel region 210, 220, 230 or 240 of memory cell 200B-200C, 300B-300C and 400B-400C (FIGS. 2B-2C, 3B-3C & 4B-4C) can be integrated into a back end of line (BEOL) process thereby increasing the memory density of memory cell 200B-200C, 300B-300C and 400B-400C.

Other configurations, connections or quantities of transistors in memory cell 200B are within the scope of the present disclosure.

FIG. 2C is a circuit diagram of a memory cell 200C, in accordance with some embodiments.

Memory cell 200C is an embodiment of a memory cell in array of memory cells 102A of FIG. 1 expressed in a schematic diagram, and similar detailed description is therefore omitted.

Memory cell 200C is usable as one or more memory cells in array of memory cells 102A of FIG. 1. Memory cell 200C includes write transistor M1', a read transistor M2', write word line WWL, read word line RWL, write bit line WBL and read bit line RBL.

Memory cell 200C is a variation of memory cell 200B of FIG. 2B, and similar detailed description is therefore omitted. In comparison with memory cell 200B of FIG. 2B, read transistor M2' replaces read transistor M2 of FIG. 2B, and similar detailed description is therefore omitted.

Read transistor M2' is shown as a PMOS transistor. In some embodiments, read transistor M2' is an NMOS transistor. In some embodiments, read transistor M2' is similar to read transistor M2 of FIGS. 2A-2B, and similar detailed description is therefore omitted. The operation of memory cell 200C is similar to the operation of memory cell 200A (described above) or memory cell 200B, and similar detailed description is therefore omitted.

In comparison with read transistor M2 of FIG. 2B, read transistor M2' includes an oxide channel region 220, and similar detailed description is therefore omitted. In some embodiments, the oxide channel region 220 for read transistor M2' includes an oxide semiconductor material including zinc oxide, cadmium oxide, indium oxide, IGZO, $SnO_2$, $TiO_2$, or combinations thereof, or the like.

In some embodiments, the oxide channel region 220 of read transistor M2' includes the same oxide semiconductor material as the oxide channel region 210 of write transistor M1'. In some embodiments, the oxide channel region 220 of read transistor M2' includes a different oxide semiconductor material as the oxide channel region 210 of write transistor M1'. Other transistor types or oxide materials for read transistor M2' are within the scope of the present disclosure.

In some embodiments, read transistor M2' includes an oxide channel region 220, and write transistor M1' includes a silicon channel region having a silicon body or bulk similar to write transistor M1.

In some embodiments, by including write transistor M1' with an oxide channel region 210 and read transistor M2' with an oxide channel region 220 and as an FeFET, memory cell 200C has lower leakage current than other read transistor approaches. In some embodiments, by reducing the leakage current of memory cell 200C, memory cell 200C has the benefits discussed above with respect to memory cell 200B. Furthermore, since memory cell 200C is similar to memory cell 200A, memory cell 200C also has the benefits discussed above with respect to memory cell 200A.

Other configurations, connections or quantities of transistors in memory cell 200C are within the scope of the present disclosure.

FIG. 3A is a circuit diagram of a memory cell 300A, in accordance with some embodiments.

Memory cell 300A is an embodiment of a memory cell in array of memory cells 102A of FIG. 1 expressed in a schematic diagram, and similar detailed description is therefore omitted.

Memory cell 300A is usable as one or more memory cells in array of memory cells 102A of FIG. 1. Memory cell 300A includes write transistor M1, read transistor M2, write word line WWL, read word line RWL, write bit line WBL, read bit line RBL and a transistor M3.

Memory cell 300A is a variation of memory cell 200A of FIG. 2A, and similar detailed description is therefore omitted. In comparison with memory cell 200A of FIG. 2A, memory cell 300A further includes transistor M3, and similar detailed description is therefore omitted.

Transistor M3 includes a source terminal coupled to read bit line RBL, a drain terminal coupled to the source terminal of read transistor M2, and a gate terminal configured to receive a control signal CS. In some embodiments, transistor M3 is turned on or turned off in response to control signal CS. For example, in some embodiments, during a read operation of a selected memory cell, similar to memory cell 300A, the selected memory cell includes a selected transistor M3, and unselected memory cells, similar to memory cell 300A, include an unselected transistor M3. In these embodiments, selected transistor M3 is turned on in response to a first value of control signal CS, and unselected transistors M3 in corresponding unselected cells are turned off in response to a second value of control signal CS. In these embodiments, the second value of control signal CS is inverted from the first value of control signal CS. In these embodiments, the transistors M3 in unselected memory cells are turned off thereby reducing leakage current.

In comparison with memory cell 200A of FIG. 2A, the source terminal of read transistor M2 of FIGS. 3A-3C is coupled with the drain terminal of transistor M3, and is therefore not directly coupled with the read bit line RBL as is shown in FIG. 2A.

Transistor M3 of FIGS. 3A-3B is enabled or disabled in response to a control signal CS. Transistor M3 is configured to electrically couple/decouple read transistor M2 to/from the read bit line RBL in response to control signal CS. For example, if control signal CS is logically low, transistor M3 is enabled or turned on, and transistor M3 thereby electrically couples the source of read transistor M2 to the read bit line RBL. For example, if control signal CS is logically high, transistor M3 is disabled or turned off, and transistor M3 thereby electrically decouples the source of read transistor M2 from the read bit line RBL.

The operation of memory cell 300A is similar to the operation of memory cell 200A described above, and similar detailed description is therefore omitted. For example, in comparison with the write operation of memory cell 200A of FIG. 2A, during the write operation of memory cell 300A, transistor M3 is disabled or turned off, and the operation of the other portions of memory cell 300A are similar to the write operation of memory cell 200A described above, and similar detailed description is therefore omitted. For example, in comparison with the read operation of memory cell 200A of FIG. 2A, during the read operation of memory cell 300A, transistor M3 is enabled or turned on, and the operation of the other portions of memory cell 300A are similar to the read operation of memory cell 200A described above, and similar detailed description is therefore omitted.

Transistor M3 is shown as a PMOS transistor. In some embodiments, transistor M3 is an NMOS transistor.

In some embodiments, transistor M3 and at least write transistor M1 or read transistor M2, include channel regions that are formed of a same type of material. In some embodiments, transistor M3 has a channel region that has a silicon body or bulk. In some embodiments, transistor M3 and at least write transistor M1 or read transistor M2, include channel regions that have a silicon body or bulk.

In some embodiments, by including write transistor M1, read transistor M2 (e.g., FeFET), and transistor M3, memory cell 300A is similar to memory cell 200A. In some embodiments, since memory cell 300A is similar to memory cell 200A, memory cell 300A has the benefits discussed above with respect to memory cell 200A.

In some embodiments, memory cell 300A and memory cells 300B-300C (FIGS. 3B-3C) have a 3T memory cell structure that is compatible with CMOS processes and is therefore scalable.

Other transistor terminals for each of transistors M1, M2, M3, M1', M2' and M3' of the present application are within the scope of the present disclosure. For example, reference to the drains and sources of a same transistor in the present disclosure can be changed to a source and a drain of the same transistor.

Other configurations or quantities of transistors in memory cell 300A are within the scope of the present disclosure.

FIG. 3B is a circuit diagram of a memory cell 300B, in accordance with some embodiments.

Memory cell 300B is an embodiment of a memory cell in array of memory cells 102A of FIG. 1 expressed in a schematic diagram, and similar detailed description is therefore omitted.

Memory cell 300B is usable as one or more memory cells in array of memory cells 102A of FIG. 1. Memory cell 300B includes write transistor M1', read transistor M2, write word line WWL, read word line RWL, write bit line WBL, read bit line RBL and transistor M3.

Memory cell 300B is a variation of memory cell 300A of FIG. 3A and memory cell 200B of FIG. 2B, and similar detailed description is therefore omitted. For example, memory cell 300B combines features similar to memory cell 300A of FIG. 3A and memory cell 200B of FIG. 2B.

In comparison with memory cell 300A of FIG. 3A, write transistor M1' of FIG. 2B replaces write transistor M1 of FIG. 3A, and similar detailed description is therefore omitted.

Write transistor M1' is described in memory cell 200B of FIG. 2B, and similar detailed description is therefore omitted. Write transistor M1' is shown as a PMOS transistor. In some embodiments, write transistor M1' is an NMOS transistor. The operation of memory cell 300B is similar to the operation of memory cell 300A described above, and similar detailed description is therefore omitted.

In some embodiments, by including write transistor M1' with an oxide channel region 210, read transistor M2 (e.g., FeFET) and transistor M3, memory cell 300B achieves benefits similar to the benefits discussed above with respect to memory cell 300A and memory cell 200B.

Furthermore, since memory cell 300B is similar to memory cell 200A, memory cell 300B also has the benefits discussed above with respect to memory cell 200A.

Other configurations, connections or quantities of transistors in memory cell 300B are within the scope of the present disclosure.

FIG. 3C is a circuit diagram of a memory cell 300C, in accordance with some embodiments.

Memory cell 300C is an embodiment of a memory cell in array of memory cells 102A of FIG. 1 expressed in a schematic diagram, and similar detailed description is therefore omitted.

Memory cell 300C is usable as one or more memory cells in array of memory cells 102A of FIG. 1. Memory cell 300C includes write transistor M1', read transistor M2', write word line WWL, read word line RWL, write bit line WBL, read bit line RBL and a transistor M3'.

Memory cell 300C is a variation of memory cell 300B of FIG. 3B, and similar detailed description is therefore omitted. In comparison with memory cell 300B of FIG. 3B, read transistor M2' replaces read transistor M2 of FIG. 3B and transistor M3' replaces transistor M3 of FIG. 3B, and similar detailed description is therefore omitted.

Read transistor M2' is described in memory cell 200C of FIG. 2C, and similar detailed description is therefore omitted. Read transistor M2' is shown as a PMOS transistor. In some embodiments, read transistor M2' is an NMOS transistor.

Transistor M3' is shown as a PMOS transistor. In some embodiments, transistor M3' is an NMOS transistor. In some embodiments, transistor M3' is similar to transistor M3 of FIGS. 3A-3B, and similar detailed description is therefore omitted. The operation of memory cell 300C is similar to the operation of memory cell 300A (described above) or memory cell 300B, and similar detailed description is therefore omitted.

In comparison with transistor M3 of FIG. 3B, transistor M3' includes an oxide channel region 230, and similar detailed description is therefore omitted. In some embodiments, the oxide channel region 230 for transistor M3' includes an oxide semiconductor material including zinc oxide, cadmium oxide, indium oxide, IGZO, $SnO_2$, $TiO_2$, or combinations thereof, or the like.

In some embodiments, the oxide channel region 230 of transistor M3' includes the same oxide semiconductor material as the oxide channel region 210, 220 of at least write transistor M1' or read transistor M2'. In some embodiments, the oxide channel region 230 of transistor M3' includes a different oxide semiconductor material as the oxide channel region 210, 220 of at least write transistor M1' or read transistor M2'. Other transistor types or oxide materials for transistor M3' are within the scope of the present disclosure.

In some embodiments, one of read transistor M2' or transistor M3' includes an oxide channel region 220 or 230, and the other of read transistor M2' or transistor M3' includes a silicon channel region having a silicon body or bulk similar to read transistor M2 or transistor M3, respectively.

In some embodiments, by including write transistor M1' with an oxide channel region 210, read transistor M2' with an oxide channel region 220 and as an FeFET, and transistor M3' with an oxide channel region 230, memory cell 300C achieves benefits similar to the benefits discussed above with respect to memory cell 300A and memory cell 200C. Furthermore, since memory cell 300C is similar to memory cell 200A, memory cell 300C also has the benefits discussed above with respect to memory cell 200A.

Other configurations, connections or quantities of transistors in memory cell 300C are within the scope of the present disclosure.

FIG. 4A is a circuit diagram of a memory cell 400A, in accordance with some embodiments.

Memory cell 400A is an embodiment of a memory cell in array of memory cells 102A of FIG. 1 expressed in a schematic diagram, and similar detailed description is therefore omitted.

Memory cell 400A is usable as one or more memory cells in array of memory cells 102A of FIG. 1. Memory cell 400A includes write transistor M1, read transistor M2, write word line WWL, read word line RWL, write bit line WBL, read bit line RBL, transistor M3 and a transistor M4.

Memory cell 400A is a variation of memory cell 300A of FIG. 3A, and similar detailed description is therefore omitted. In comparison with memory cell 300A of FIG. 3A, memory cell 400A further includes transistor M4, and similar detailed description is therefore omitted.

Transistor M4 includes a drain terminal, a gate terminal and a source terminal. The drain terminal of transistor M4 is coupled to read write line RWL. The gate terminal of transistor M4 is coupled to the drain terminal of write transistor M1, the gate terminal of read transistor M2 and node ND1. The source terminal of transistor M4 is coupled to a node ND2. In some embodiments, node ND2 is electrically coupled to a reference voltage supply. In some embodiments, the reference voltage supply has a reference voltage VSS. In some embodiments, the reference voltage supply corresponds to ground.

Transistor M4 of FIGS. 4A-4C is enabled or disabled in response to a voltage of node ND1. In some embodiments, the voltage of node ND1 corresponds to the write bit line signal, and thus transistor M4 of FIGS. 4A-4C is enabled or disabled in response to the write bit line signal.

Transistor M4 of FIGS. 4A-4C is configured to electrically couple/decouple the read word line RWL to/from node ND2 in response to the write bit line signal on the write bit line WBL. For example, if the write bit line signal is logically low, transistor M4 is enabled or turned on, and transistor M4 thereby electrically couples the read word line RWL to node ND2. For example, if the write bit line signal is logically high, transistor M4 is disabled or turned off, and transistor M4 thereby electrically decouples the read word line RWL from node ND2.

In comparison with memory cell 300A of FIG. 3A, the drain terminal of read transistor M2 of FIGS. 4A-4C is coupled with a reference voltage supply. In some embodiments, the reference voltage supply has a reference voltage VSS. In some embodiments, the reference voltage supply corresponds to ground.

In comparison with memory cell 300A of FIG. 3A, the gate terminal of transistor M3 of FIGS. 4A-4C is coupled with the read word line RWL. Transistor M3 of FIGS. 4A-4C is enabled or disabled in response to a read word line signal on the read word line RWL. Transistor M3 of FIGS. 4A-4C is configured to electrically couple/decouple read transistor M2 to/from the read bit line RBL in response to the read word line signal on the read word line RWL. For example, if the read word line signal is logically low, transistor M3 is enabled or turned on, and transistor M3 thereby electrically couples the source of read transistor M2 to the read bit line RBL. For example, if the read word line signal is logically high, transistor M3 is disabled or turned off, and transistor M3 thereby electrically decouples the source of read transistor M2 from the read bit line RBL.

The operation of memory cell 400A is similar to the operation of memory cell 200A described above, and similar detailed description is therefore omitted. For example, in comparison with the write operation of memory cell 200A of FIG. 2A and memory cell 300A of FIG. 3A, during the write operation of memory cell 400A, transistor M4 is enabled or disabled in response to the write bit line signal on the write bit line WBL, transistor M3 is enabled or disabled in response to the read word line signal on the read word line RWL, and the operation of the other portions of memory cell 400A are similar to the write operation of memory cell 200A described above, and similar detailed description is therefore omitted.

During a read operation of memory cell 400A, the voltage of the read bit line RBL is pre-charged to a logical high, and the read word line RWL is lowered to a logical low causing transistor M3 to be enabled or turned on. In some embodiments, if the read transistor M2 of FIGS. 4A-4C is in a low resistance state, then the read transistor M2 is turned on or conducting, and the voltage of the read bit line RBL is pulled towards VSS by read transistor M2, and the voltage or current of the read bit line RBL is sensed by a sense amplifier (not shown), and the data associated with the read transistor M2 being in a low resistance state (e.g., "1" or "0") is read out. In some embodiments, if the read transistor M2 of FIGS. 4A-4C is in a high resistance state, then the read transistor M2 is turned off or not conducting, and the voltage of the read bit line RBL is not pulled towards VSS by read transistor M2, and the voltage or current of the read bit line RBL is sensed by a sense amplifier (not shown), and the data associated with the read transistor M2 being in a high resistance state (e.g., "1" or "0") is read out. In this embodiment, the change in the voltage of the read bit line RBL is negligible since the read transistor M2 is turned off. Afterwards, the read word line RWL is set to a logical high thereby causing transistor M3 to turn off.

Transistor M4 is shown as a PMOS transistor. In some embodiments, transistor M4 is an NMOS transistor.

In some embodiments, transistor M4 and at least write transistor M1, read transistor M2 or transistor M3, include channel regions that are formed of a same type of material. In some embodiments, transistor M4 has a channel region that has a silicon body or bulk.

In some embodiments, by including write transistor M1, read transistor M2 (e.g., FeFET), transistor M3 and transistor M4, memory cell 400A is similar to memory cell 200A. In some embodiments, since memory cell 400A is similar to memory cell 200A, memory cell 400A has the benefits discussed above with respect to memory cell 200A.

In some embodiments, memory cell 400A and memory cells 400B-400C (FIGS. 4B-4C) have a 4T memory cell structure that is compatible with CMOS processes and is therefore scalable.

Other transistor terminals for each of transistors M1, M2, M3, M4, M1', M2', M3' and M4' of the present application are within the scope of the present disclosure. For example, reference to the drains and sources of a same transistor in the present disclosure can be changed to a source and a drain of the same transistor.

Other configurations or quantities of transistors in memory cell 400A are within the scope of the present disclosure.

FIG. 4B is a circuit diagram of a memory cell 400B, in accordance with some embodiments.

Memory cell 400B is an embodiment of a memory cell in array of memory cells 102A of FIG. 1 expressed in a schematic diagram, and similar detailed description is therefore omitted.

Memory cell 400B is usable as one or more memory cells in array of memory cells 102A of FIG. 1. Memory cell 400B includes write transistor M1', read transistor M2, write word line WWL, read word line RWL, write bit line WBL, read bit line RBL, transistor M3 and transistor M4.

Memory cell 400B is a variation of memory cell 400A of FIG. 4A and memory cell 200B of FIG. 2B, and similar detailed description is therefore omitted. For example, memory cell 400B combines features similar to memory cell 400A of FIG. 4A and memory cell 200B of FIG. 2B.

In comparison with memory cell 400A of FIG. 4A, write transistor M1' of FIG. 2B replaces write transistor M1 of FIG. 4A, and similar detailed description is therefore omitted.

Write transistor M1' is described in memory cell 200B of FIG. 2B, and similar detailed description is therefore omitted. Write transistor M1' is shown as a PMOS transistor. In some embodiments, write transistor M1' is an NMOS transistor. The operation of memory cell 400B is similar to the operation of memory cell 400A described above, and similar detailed description is therefore omitted.

In some embodiments, by including write transistor M1' with an oxide channel region 210 and read transistor M2 (e.g., FeFET), transistor M3 and transistor M4, memory cell 400B achieves benefits similar to the benefits discussed above with respect to memory cell 400A and memory cell 200B.

Furthermore, since memory cell 400B is similar to memory cell 200A, memory cell 300B also has the benefits discussed above with respect to memory cell 200A.

Other configurations, connections or quantities of transistors in memory cell 400B are within the scope of the present disclosure.

FIG. 4C is a circuit diagram of a memory cell 400C, in accordance with some embodiments.

Memory cell 400C is an embodiment of a memory cell in array of memory cells 102A of FIG. 1 expressed in a schematic diagram, and similar detailed description is therefore omitted.

Memory cell 400C is usable as one or more memory cells in array of memory cells 102A of FIG. 1. Memory cell 400C includes write transistor M1', read transistor M2', write word line WWL, read word line RWL, write bit line WBL, read bit line RBL, transistor M3' and a transistor M4'.

Memory cell 400C is a variation of memory cell 400B of FIG. 4B, and similar detailed description is therefore omitted. In comparison with memory cell 400B of FIG. 4B, read transistor M2' replaces read transistor M2 of FIG. 4B, transistor M3' replaces transistor M3 of FIG. 4B and transistor M4' replaces transistor M4 of FIG. 4B, and similar detailed description is therefore omitted.

Read transistor M2' is described in memory cell 200C of FIG. 2C, and similar detailed description is therefore omitted. Read transistor M2' is shown as a PMOS transistor. In some embodiments, read transistor M2' is an NMOS transistor.

Transistor M3' is described in memory cell 300C of FIG. 3C, and similar detailed description is therefore omitted. Transistor M3' is shown as a PMOS transistor. In some embodiments, transistor M3' is an NMOS transistor.

Transistor M4' is shown as a PMOS transistor. In some embodiments, transistor M4' is an NMOS transistor. In some embodiments, transistor M4' is similar to transistor M4 of FIGS. 4A-4B, and similar detailed description is therefore omitted. The operation of memory cell 400C is similar to the operation of memory cell 400A (described above) or memory cell 400B, and similar detailed description is therefore omitted.

In comparison with transistor M4 of FIG. 4B, transistor M4' includes an oxide channel region 240, and similar detailed description is therefore omitted. In some embodiments, the oxide channel region 240 for transistor M4' includes an oxide semiconductor material including zinc oxide, cadmium oxide, indium oxide, IGZO, $SnO_2$, $TiO_2$, or combinations thereof, or the like.

In some embodiments, the oxide channel region 240 of transistor M4' includes the same oxide semiconductor material as the oxide channel region 210, 220 or 230 of at least write transistor M1', read transistor M2' or transistor M3'. In some embodiments, the oxide channel region 240 of transistor M4' includes a different oxide semiconductor material as the oxide channel region 210, 220 or 230 of at least write transistor M1', read transistor M2' or transistor M3', respectively. Other transistor types or oxide materials for transistor M4' are within the scope of the present disclosure.

In some embodiments, one of read transistor M2', transistor M3' or transistor M4' includes an oxide channel region 220, 230 or 240, and the other of read transistor M2', transistor M3' or transistor M4 includes a silicon channel region having a silicon body or bulk similar to read transistor M2, transistor M3 or transistor M4, respectively.

In some embodiments, by including write transistor M1' with an oxide channel region 210, read transistor M2' with an oxide channel region 220 and as an FeFET, transistor M3' with an oxide channel region 230 and transistor M4' with an oxide channel region 240, memory cell 400C achieves benefits similar to the benefits discussed above with respect to memory cell 400A and memory cell 200C. Furthermore, since memory cell 400C is similar to memory cell 200A, memory cell 400C also has the benefits discussed above with respect to memory cell 200A.

Other configurations, connections or quantities of transistors in memory cell 400C are within the scope of the present disclosure.

Figure 5:
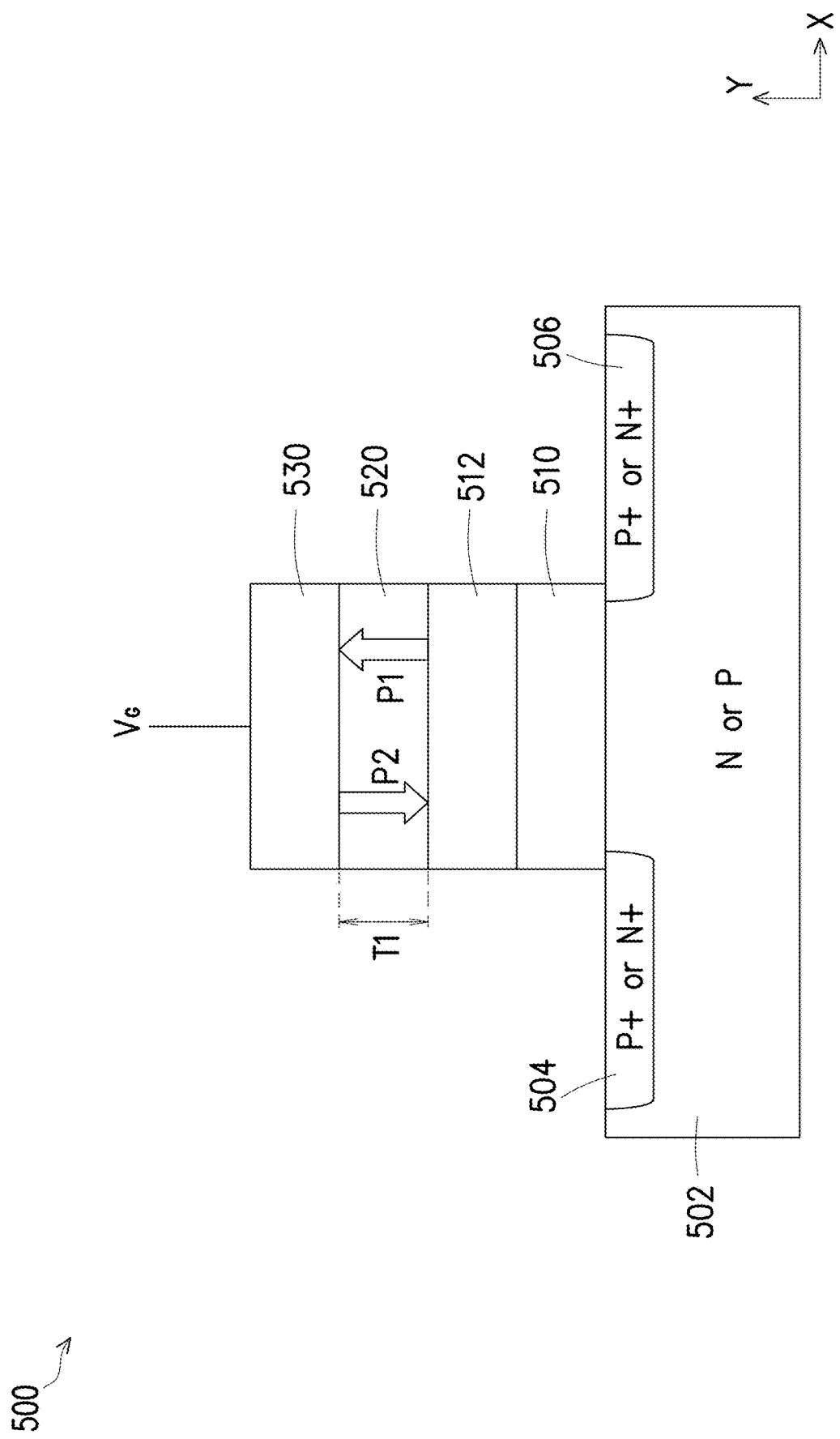
FIG. 5 is a cross-sectional view of an integrated circuit, in accordance with some embodiments.

FIG. 5 is a cross-sectional view of an integrated circuit 500, in accordance with some embodiments.

Integrated circuit 500 is an embodiment of read transistor M2 and M2' of FIGS. 2A-2C, 3A-3C and 4A-4C, and similar detailed description is therefore omitted. In some embodiments, integrated circuit 500 includes additional elements not shown for ease of illustration.

Integrated circuit 500 is shown as a planar transistor; however, other transistors are within the scope of the present disclosure. In some embodiments, integrated circuit 500 is a fin field effect transistor (FinFET), a nanosheet transistor, a nanowire transistor, or the like. In some embodiments, integrated circuit 500 is an FeFET or the like, and is manufactured as part of a back end of line (BEOL) process.

Integrated circuit 500 includes a substrate 502. In some embodiments, substrate 502 is a p-type substrate. In some embodiments, substrate 502 is an n-type substrate. In some embodiments, substrate 502 includes an elemental semiconductor including silicon or germanium in crystal, polycrystalline, or an amorphous structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; or combinations thereof. In some embodiments, the alloy semiconductor substrate has a gradient SiGe feature in which the Si and Ge composition change from one ratio at one location to another ratio at another location of the gradient SiGe feature. In some embodiments, the alloy SiGe is formed over a silicon substrate. In some embodiments, first substrate 502 is a strained SiGe substrate. In some embodiments, the semiconductor substrate has a semiconductor on insulator structure, such as a silicon on insulator (SOI) structure. In some embodiments, the semiconductor substrate includes a doped epi layer or a buried layer.

In some embodiments, the compound semiconductor substrate has a multilayer structure, or the substrate includes a multilayer compound semiconductor structure.

In some embodiments, integrated circuit 500 is a silicon transistor (e.g., has a silicon channel region (not labelled)), and substrate 502 has a silicon body or bulk. In some embodiments, integrated circuit 500 is an oxide transistor (e.g., has an oxide channel region 210, 220, 230 or 240), and substrate 502 includes an oxide semiconductor material including zinc oxide, cadmium oxide, indium oxide, IGZO, $SnO_2$, $TiO_2$, or combinations thereof, or the like.

Integrated circuit 500 further includes a drain region 504 and a source region 506 in substrate 502. In some embodiments, at least a portion of source region 506 or a portion of drain region 504 extends above substrate 502. In some embodiments, the source region 506 and the drain region 504 are embedded in substrate 502.

Drain region 504 is an embodiment of the drain terminal of read transistor M2 and M2' of FIGS. 2A-2C, 3A-3C and 4A-4C, and similar detailed description is therefore omitted. Source region 506 is an embodiment of the source terminal of read transistor M2 and M2' of FIGS. 2A-2C, 3A-3C and 4A-4C, and similar detailed description is therefore omitted. In some embodiments, the drain region 504 and source region 506 of FIG. 5 is referred to as an oxide definition (OD) region which defines the source or drain diffusion regions of integrated circuit 500 or read transistor M2 and M2' of FIGS. 2A-2C, 3A-3C and 4A-4C, and similar detailed description is therefore omitted.

In some embodiments, the drain region 504 and source region 506 of FIG. 5 is referred to as an oxide definition (OD) region which defines the source or drain diffusion regions of integrated circuit 500 or read transistor M2 and M2' of FIGS. 2A-2C, 3A-3C and 4A4C, and similar detailed description is therefore omitted.

In some embodiments, integrated circuit 500 is a P-type FeFET transistor, therefore the substrate 502 is an N-type region, the drain region 504 is a P-type active region having P-type dopants implanted in substrate 502, and the source region 506 is a P-type active region having P-type dopants implanted in substrate 502.

In some embodiments, integrated circuit 500 is an N-type FeFET transistor, therefore the substrate 502 is a P-type region, the drain region 504 is an N-type active region having N-type dopants implanted in substrate 502, and the source region 506 is a an N-type active region having N-type dopants implanted in substrate 502.

In some embodiments, N-type dopants include phosphorus, arsenic or other suitable N-type dopants. In some embodiments, P-type dopants include boron, aluminum or other suitable p-type dopants.

Integrated circuit 500 further includes an insulating layer 510 on substrate 502. In some embodiments, the insulating layer 510 is between the drain region 504 and the source region 506. In some embodiments, the insulating layer 510 is a gate dielectric layer. In some embodiments, the insulating layer includes an insulating material including SiO, $SiO_2$ or combinations thereof, or the like. In some embodiments, insulating layer 510 includes a gate oxide or the like.

Integrated circuit 500 further includes a metal layer 512 over the insulating layer 510. In some embodiments, the metal layer 512 includes Cu, TiN, W or combinations thereof, or the like. In some embodiments, the metal layer 512 is a conductive layer including doped polysilicon. In some embodiments, integrated circuit 500 does not include metal layer 512.

Integrated circuit 500 further includes a ferroelectric layer 520 over at least the conductive layer 512 or the insulating layer 510. In some embodiments, where integrated circuit 500 does not include metal layer 512, ferroelectric layer 520 is on the insulating layer 510. Ferroelectric layer 520 is an embodiment of ferroelectric region 202 of FIGS. 2A-2C, 3A-3C and 4A4C, and similar detailed description is therefore omitted.

In some embodiments, ferroelectric layer 520 includes a ferroelectric material. In some embodiments, a ferroelectric material includes $HfO_2$, HfZrO, HfO, perovskite, SBT, PZT or combinations thereof, or the like.

Ferroelectric layer 520 has polarization states P1 or P2 that correspond to polarization states P+ or P− in FIG. 2A, and similar detailed description is therefore omitted. Polarization state P1 points in a first direction Y. Polarization state P2 points in a second direction (e.g., negative Y) opposite of the first direction Y.

FIG. 5 shows both polarization states P1 and P2. However, in some embodiments, due to the non-volatility of the ferroelectric layer 520, once the polarization state P1 or P2 of integrated circuit 500 is set based on the gate voltage VG, integrated circuit 500 includes one of the polarization states P1 or P2.

The ferroelectric layer 520 creates a capacitance in integrated circuit 500. Furthermore, the MOS transistor of integrated circuit 500 also has a capacitance. In some embodiments, the capacitance of the ferroelectric layer 520 and the capacitance of the MOS transistor are matched to operate integrated circuit 500 in a non-volatile mode. In some embodiments, the capacitance of the ferroelectric layer 520 is adjusted based on a thickness T1 of the ferroelectric layer 520. In some embodiments, by changing thickness T1, integrated circuit 500 can operate in a non-volatile mode or a volatile mode.

In some embodiments, the thickness T1 of the ferroelectric layer 520 ranges from about 3 nanometers (nm) to about 50 nm. In some embodiments, as the thickness T1 increases, the ability of the ferroelectric layer 520 to preserve the hysteresis and bi-stable polarization states (e.g., P1 or P2) is increased and the leakage current of integrated circuit 500 decreases. In some embodiments, as the thickness T1 decreases, the ability of the ferroelectric layer 520 to preserve the hysteresis and bi-stable polarization states (e.g., P1 or P2) is reduced and the leakage current of integrated circuit 500 increases. In some embodiments, integrated circuit 500 does not include the insulating layer 510 and metal layer 512, and the ferroelectric layer 520 is directly on substrate 502. In some embodiments, integrated circuit 500 does not include the insulating layer 510, and the metal layer 512 is directly on substrate 502.

Integrated circuit 500 further includes a gate structure 530 over the ferroelectric layer 520. The gate structure 530 includes a conductive material such as a metal or doped polysilicon (also referred to herein as "POLY").

In some embodiments, integrated circuit 500 is an embodiment of write transistor M1 and M1' of FIGS. 2A-2C, 3A-3C and 4A-4C. In these embodiments, integrated circuit 500 does not include the ferroelectric layer 520.

By being included in memory cell array 100 and memory circuit 200A-200C, 300A-300C and 400A-400C discussed above with respect to FIGS. 1, 2A-2C, 3A-3C and 4A-4C, integrated circuit 500 operates to achieve the benefits discussed above with respect to memory cell array 100 and memory circuit 200A-200C, 300A-300C and 400A-400C.

Figure 6:
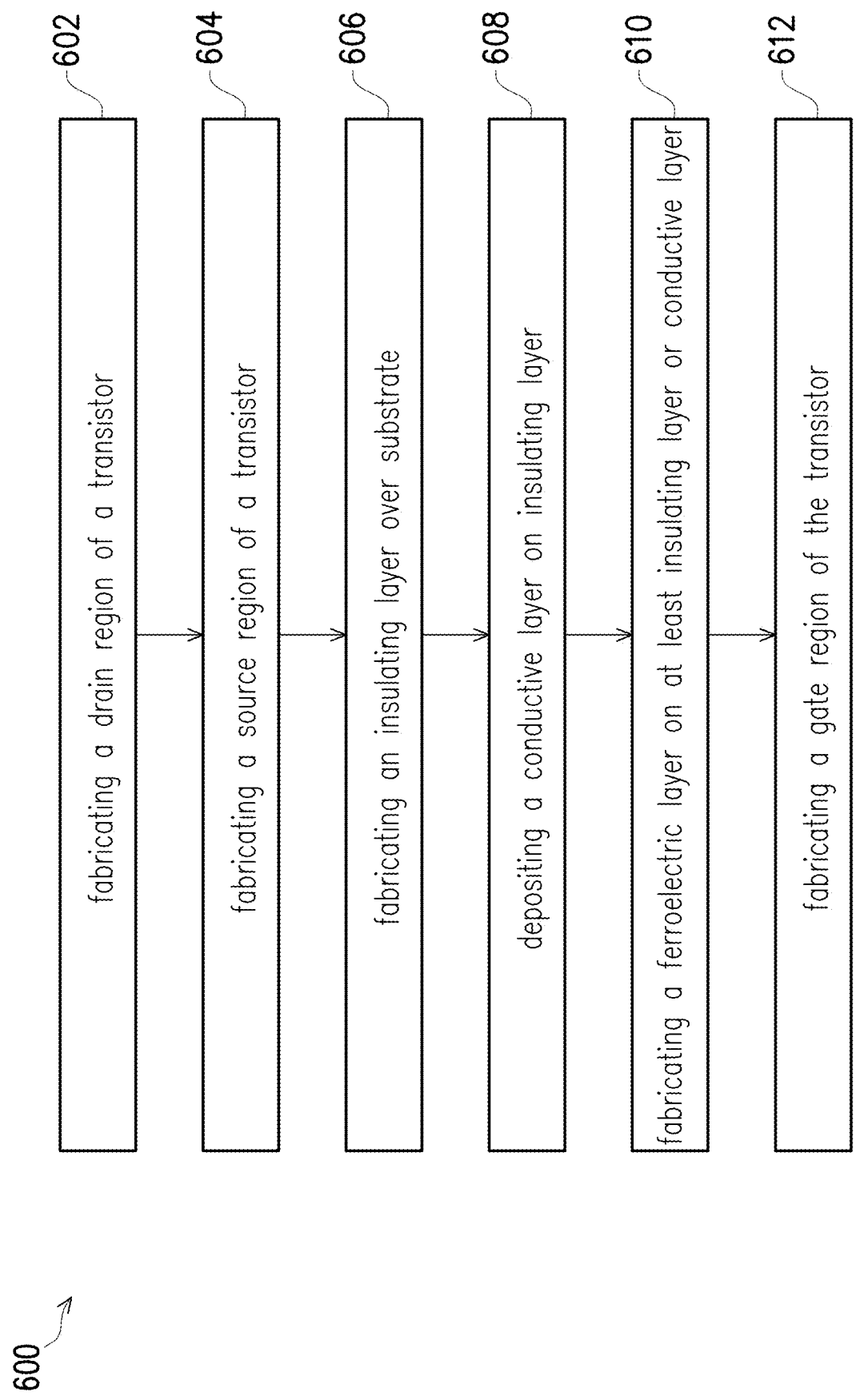
FIG. 6 is a functional flow chart of a method of manufacturing an integrated circuit, in accordance with some embodiments.

FIG. 6 is a functional flow chart of a method 600 of manufacturing an integrated circuit (IC), in accordance with some embodiments. It is understood that additional operations may be performed before, during, and/or after the method 600 depicted in FIG. 6, and that some other processes may only be briefly described herein. In some embodiments, other order of operations of method 600 is within the scope of the present disclosure. Method 600 includes exemplary operations, but the operations are not necessarily performed in the order shown. Operations may be added, replaced, changed order, and/or eliminated as appropriate, in accordance with the spirit and scope of disclosed embodiments. In some embodiments, one or more of the operations of method 600 is not performed.

In some embodiments, the method 600 is usable to manufacture or fabricate at least memory cell array 100 (FIG. 1), memory cell 200A-200C, 300A-300C or 400A-400C (FIG. 2A-2C, 3A-3C or 4A-4C) or integrated circuit 500 (FIG. 5).

In operation 602 of method 600, the drain region 504 of a transistor is fabricated in substrate 502. In some embodiments, the drain region of method 600 includes at least the drain of read transistor M2 or M2'. In some embodiments, the transistor of method 600 includes at least read transistor M2 or M2'. In some embodiments, the drain region is fabricated in a first well within the substrate, and the first well has a dopant opposite of the dopant of the drain region.

In some embodiments, the transistor of method 600 includes at least transistor M1, M1', M3, M3', M4 or M4'. In some embodiments, the drain region of method 600 includes at least the drain of transistor M1, M1', M3, M3', M4 or M4'.

In operation 604 of method 600, the source region 504 of the transistor is fabricated in substrate 502. In some embodiments, the source region of method 600 includes at least the source of read transistor M2 or M2'. In some embodiments, the transistor of method 600 includes at least read transistor M2 or M2'. In some embodiments, the source region is fabricated in the first well. In some embodiments, the source region of method 600 includes at least the source of transistor M1, M1', M3, M3', M4 or M4'.

In some embodiments, at least operation 602 or 604 includes the formation of source/drain features that are formed in the substrate. In some embodiments, the formation of the source/drain features includes, a portion of the substrate is removed to form recesses, and a filling process is then performed by filling the recesses in the substrate. In some embodiments, the recesses are etched, for example, a wet etching or a dry etching, after removal of a pad oxide layer or a sacrificial oxide layer. In some embodiments, the etch process is performed to remove a top surface portion of the active region. In some embodiments, the filling process is performed by an epitaxy or epitaxial (epi) process. In some embodiments, the recesses are filled using a growth process which is concurrent with an etch process where a growth rate of the growth process is greater than an etch rate of the etch process. In some embodiments, the recesses are filled using a combination of growth process and etch process. For example, a layer of material is grown in the recess and then the grown material is subjected to an etch process to remove a portion of the material. Then a subsequent growth process is performed on the etched material until a desired thickness of the material in the recess is achieved. In some embodiments, the growth process continues until a top surface of the material is above the top surface of the substrate. In some embodiments, the growth process is continued until the top surface of the material is co-planar with the top surface of the substrate. In some embodiments, a portion of substrate 502 is removed by an isotropic or an anisotropic etch process. The etch process selectively etches substrate 502 without etching gate structure 530. In some embodiments, the etch process is performed using a reactive ion etch (RIE), wet etching, or other suitable techniques. In some embodiments, a semiconductor material is deposited in the recesses to form the source/drain features. In some embodiments, an epi process is performed to deposit the semiconductor material in the recesses. In some embodiments, the epi process includes a selective epitaxy growth (SEG) process, CVD process, molecular beam epitaxy (MBE), other suitable processes, and/or combination thereof. The epi process uses gaseous and/or liquid precursors, which interacts with a composition of the substrate. In some embodiments, the source/drain features include epitaxially grown silicon (epi Si), silicon carbide, or silicon germanium. Source/drain features of the IC device associated with gate structure 530 are in-situ doped or undoped during the epi process in some instances. When source/drain features are undoped during the epi process, source/drain features are doped during a subsequent process in some instances. The subsequent doping process is achieved by an ion implantation, plasma immersion ion implantation, gas and/or solid source diffusion, other suitable processes, and/or combination thereof. In some embodiments, source/drain features are further exposed to annealing processes after forming source/drain features and/or after the subsequent doping process.

In some embodiments, source/drain features have n-type dopants that include phosphorus, arsenic or other suitable n-type dopants. In some embodiments, the n-type dopant concentration ranges from about $1\times10^{12}$ atoms/cm2 to about $1\times10^{14}$ atoms/cm2.

In some embodiments, source/drain features have p-type dopants that include boron, aluminum or other suitable p-type dopants. In some embodiments, the p-type dopant concentration ranges from about $1\times10^{12}$ atoms/cm2 to about $1\times10^{14}$ atoms/cm2.

In operation 606 of method 600, an insulating layer 510 is fabricated on the substrate 502. In some embodiments, at least fabricating the insulating layer 510 of operation 610 includes performing one or more deposition processes to form one or more dielectric material layers. In some embodiments, a deposition process includes a chemical vapor deposition (CVD), a plasma enhanced CVD (PECVD), an atomic layer deposition (ALD), or other process suitable for depositing one or more material layers.

In operation 608 of method 600, a conductive layer is deposited on the insulating layer 510. In some embodiments, the conductive layer of method 600 is metal layer 512. In some embodiments, the conductive layer of operation 608 is formed using a combination of photolithography and material removal processes to form openings in an insulating layer (not shown) over the substrate. In some embodiments, the photolithography process includes patterning a photoresist, such as a positive photoresist or a negative photoresist. In some embodiments, the photolithography process includes forming a hard mask, an antireflective structure, or another suitable photolithography structure. In some embodiments, the material removal process includes a wet etching process, a dry etching process, an RIE process, laser drilling or another suitable etching process. The openings are then filled with conductive material, e.g., copper, aluminum, titanium, nickel, tungsten, or other suitable conductive material. In some embodiments, the openings are filled using CVD, PVD, sputtering, ALD or other suitable formation process.

In operation 610 of method 600, a ferroelectric layer 520 is formed on at least the insulating layer 510 or the conductive layer (metal layer 512). In some embodiments, at least operation 606 or 608 is not performed. In some embodiments, operations 606 and 608 are not performed, and the ferroelectric layer 520 is formed directly on substrate 502. In some embodiments, operation 606 is not performed and the conductive layer (e.g., metal layer 512) is deposited on substrate 502. In some embodiments, operation 608 is not performed and the ferroelectric layer 520 is deposited on insulating layer 510.

In operation 612 of method 600, a gate region 530 of the transistor is fabricated. In some embodiments, fabricating the gate region includes performing one or more deposition processes to form one or more conductive material layers. In some embodiments, fabricating the gate regions includes forming gate electrodes. In some embodiments, gate regions are formed using a doped or non-doped polycrystalline silicon (or polysilicon). In some embodiments, the gate regions include a metal, such as Al, Cu, W, Ti, Ta, TiN, TaN, NiSi, CoSi, other suitable conductive materials, or combinations thereof.

Figure 7:
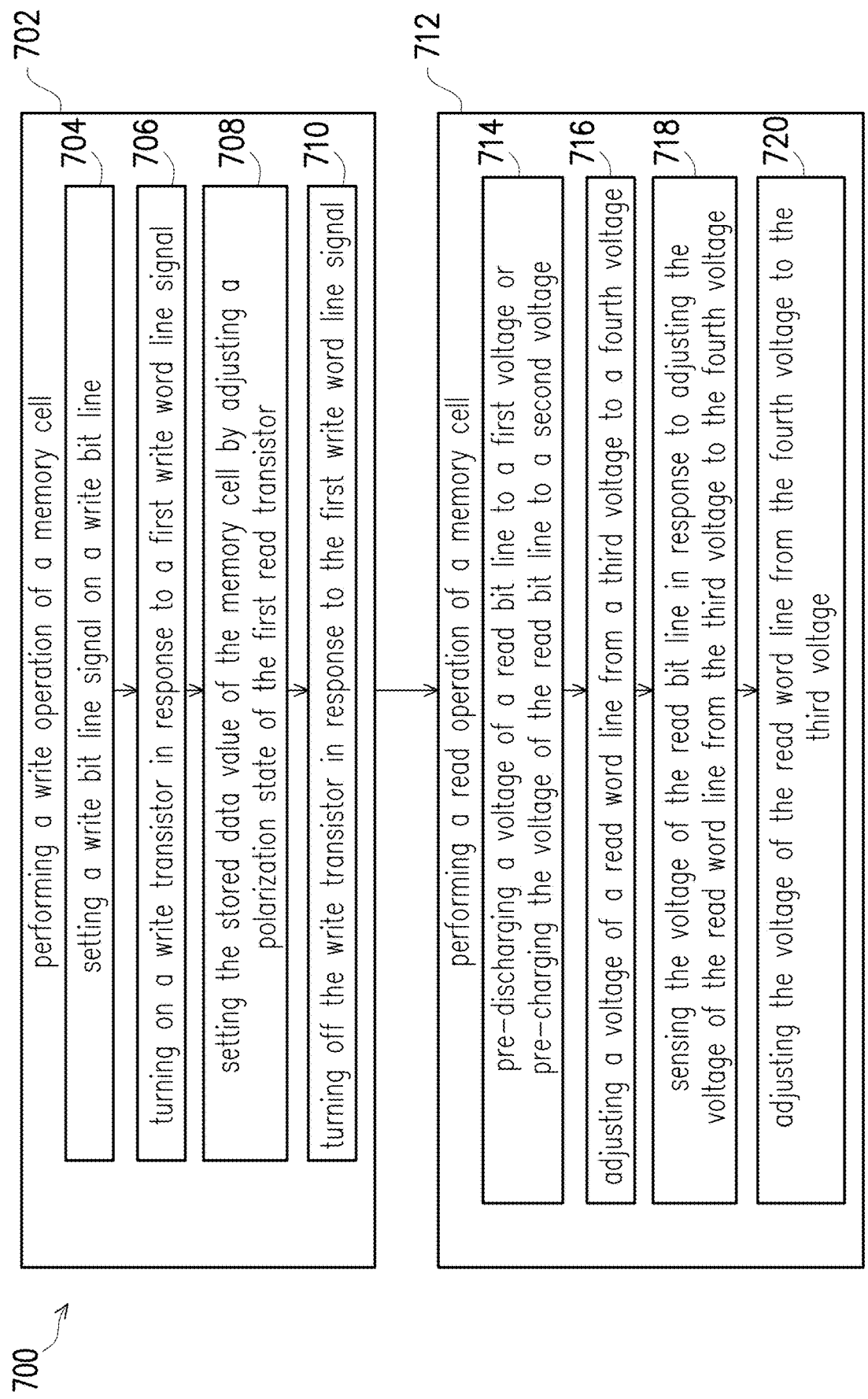
FIG. 7 is a flowchart of a method of operating a circuit, in accordance with some embodiments.

FIG. 7 is a flowchart of a method 700 of operating a circuit, in accordance with some embodiments. In some embodiments, FIG. 7 is a flowchart of method 700 of operating a memory circuit, such as memory cell array 100 of FIG. 1 or memory cell 200A-200C, 300A-300C or 400A-400C (FIG. 2A-2C, 3A-3C or 4A-4C) or integrated circuit 500 (FIG. 5).

It is understood that additional operations may be performed before, during, and/or after the method 700 depicted in FIG. 7, and that some other processes may only be briefly described herein. In some embodiments, other order of operations of method 700 is within the scope of the present disclosure. Method 700 includes exemplary operations, but the operations are not necessarily performed in the order shown. Operations may be added, replaced, changed order, and/or eliminated as appropriate, in accordance with the spirit and scope of disclosed embodiments. In some embodiments, one or more of the operations of method 700 is not performed.

In operation 702 of method 700, a write operation of a memory cell is performed. In some embodiments, the memory cell of method 700 includes memory cell 200A-200C, 300A-300C or 400A-400C. In some embodiments, the memory cell of method 700 includes at least a memory cell of memory cell array 100. In some embodiments, operation 702 includes at least operation 704, 706, 708 or 710.

In operation 704 of method 700, a write bit line signal is set on a write bit line WBL. In some embodiments, the write bit line signal of method 700 includes a write bit line signal of write bit line WBL. In some embodiments, the write bit line signal corresponds to a stored data value in the memory cell.

In operation 706 of method 700, a write transistor is turned on in response to a write word line signal thereby electrically coupling the write bit line WBL to a gate of a read transistor. In some embodiments, the write transistor of method 700 includes at least write transistor M1 or M1'. In some embodiments, the read transistor of method 700 includes at least read transistor M2 or M2'. In some embodiments, the gate of read transistor of method 700 includes at least the gate terminal of read transistor M2 or M2'. In some embodiments, the write word line signal of method 700 includes a write word line signal of write word line WWL. In some embodiments, the read transistor of method 700 includes integrated circuit 500. In some embodiments, the write transistor of method 700 includes integrated circuit 500.

In operation 708 of method 700, the stored data value of the memory cell is set by adjusting a polarization state of the read transistor thereby turning on or off the read transistor.

In some embodiments, the polarization state of the read transistor of method 700 includes the polarization state P+ or P− of at least read transistor M2 or M2'. In some embodiments, the polarization state of the read transistor of method 700 includes the polarization state P1 or P2 of integrated circuit 500. In some embodiments, the polarization state corresponds to the stored data value of the memory cell.

In operation 710 of method 700, the write transistor is turned off in response to the write word line signal thereby electrically decoupling the write bit line and the gate of the read transistor from each other. In some embodiments, operation 710 further includes holding the stored data value in the memory cell.

In operation 712 of method 700, a read operation of the memory cell is performed. In some embodiments, operation 712 includes at least operation 714, 716, 718 or 720.

In operation 714 of method 700, a voltage of a read bit line RBL is pre-discharged to a first voltage (VSS) or the voltage of the read bit line RBL is pre-charged to a second voltage (VDD) different from the first voltage. In some embodiments, the first voltage of method 700 includes reference voltage VSS. In some embodiments, the second voltage of method 700 includes supply voltage VDD.

In operation 716 of method 700, a voltage of a read word line RWL is adjusted from a third voltage to a fourth voltage. In some embodiments, the voltage of the read word line RWL is the read word line signal. In some embodiments, the third voltage of method 700 includes a voltage of a logically high signal. In some embodiments, the third voltage of method 700 includes a supply voltage VDD. In some embodiments, the fourth voltage of method 700 includes a voltage of a logically low signal. In some embodiments, the fourth voltage of method 700 includes a reference voltage VSS.

In operation 718 of method 700, the voltage of the read bit line is sensed in response to adjusting the voltage of the read word line from the third voltage to the fourth voltage thereby outputting the stored data value in the memory cell. In some embodiments, rather than sensing the voltage of the read word line, operation 718 includes sensing the current of the read bit line in response to adjusting the voltage of the read word line from the third voltage to the fourth voltage thereby outputting the stored data value in the memory cell.

In some embodiments, the stored data value of the memory cell has a first logical value corresponding to a first resistance state of the read transistor, or a second logical value corresponding to a second resistance state of the read transistor. In some embodiments, the second logical value is opposite of the first logical value. In some embodiments, the second resistance state is opposite of the first resistance state. In some embodiments, first logical value is one of logical 1 or logical 0, and the second logical value is the other of logical 0 or logical 1. In some embodiments, the first resistance state is one of the low resistance state or the high resistance state and the second resistance state is the other of the high resistance state or the low resistance state.

In some embodiments, adjusting the voltage of the read word line RWL from the third voltage to the fourth voltage of operation 718 comprises turning on a first transistor in response to a first control signal or the voltage of the read word line being the fourth voltage thereby electrically coupling the read bit line to a source of the read transistor. In some embodiments, the first transistor of method 700 includes transistor M3 or M3'. In some embodiments, the first control signal of method 700 includes control signal CS. In some embodiments, the source of the read transistor of method 700 includes the source terminal of read transistor M2 or M2'.

In operation 720 of method 700, the voltage of the read word line is adjusted from the fourth voltage to the third voltage. In some embodiments, adjusting the voltage of the read word line from the fourth voltage to the third voltage of operation 720 comprises turning off the first transistor in response to the first control signal or the voltage of the read word line being the third voltage thereby electrically decoupling the read bit line and the source of the read transistor from each other.

By operating method 700, the memory circuit operates to achieve the benefits discussed above with respect to memory cell array 100 of FIG. 1 or memory cell 200A-200C, 300A-300C or 400A-400C (FIG. 2A-2C, 3A-3C or 4A-4C) or integrated circuit 500 (FIG. 5).

While method 700 was described above with reference to a single memory cell of memory cell array 100, it is understood that method 700 applies to each row and each column of memory cell array 100, in some embodiments.

Furthermore, various PMOS or NMOS transistors shown in FIG. 2A-2C, 3A-3C or 4A-4C are of a particular dopant type (e.g., N-type or P-type) are for illustration purposes. Embodiments of the disclosure are not limited to a particular transistor type, and one or more of the PMOS or NMOS transistors shown in FIG. 2A-2C, 3A-3C or 4A-4C can be substituted with a corresponding transistor of a different transistor/dopant type. Similarly, the low or high logical value of various signals used in the above description is also for illustration. Embodiments of the disclosure are not limited to a particular logical value when a signal is activated and/or deactivated. Selecting different logical values is within the scope of various embodiments. Selecting different numbers of transistors in FIG. 2A-2C, 3A-3C or 4A-4C is within the scope of various embodiments.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

One aspect of this description relates to a memory cell. The memory cell includes a write bit line, a write transistor and a read transistor. The write transistor is coupled between the write bit line and a first node. The read transistor is coupled to the write transistor by the first node. The read transistor includes a ferroelectric layer. The write transistor is configured to set a stored data value of the memory cell by a write bit line signal that adjusts a polarization state of the read transistor. In some embodiments, the polarization state corresponds to the stored data value.

Another aspect of this description relates to a memory cell. The memory cell includes a write bit line, a write word line, a write transistor of a first type and a read transistor of the first type. In some embodiments, the write transistor is coupled to the write bit line, the write word line and a first node. In some embodiments, the write transistor is configured to be enabled or disabled in response to a write word line signal. In some embodiments, the read transistor includes a first gate terminal coupled to the write transistor by the first node, and a ferroelectric layer having a polarization state that corresponds to a stored data value in the memory cell. In some embodiments, the write transistor is configured to set the stored data value in the memory cell by the write word line signal that adjusts the polarization state of the ferroelectric layer.

Still another aspect of this description relates to a method of operating a memory cell. The method includes performing a write operation of the memory cell. In some embodiments, the performing the write operation of the memory cell includes setting a write bit line signal on a write bit line, the write bit line signal corresponding to a stored data value in the memory cell. In some embodiments, the performing the write operation of the memory cell further includes turning on a write transistor in response to a write word line signal thereby electrically coupling the write bit line to a gate of a read transistor. In some embodiments, the performing the write operation of the memory cell further includes setting the stored data value of the memory cell by adjusting a polarization state of the read transistor thereby turning on or off the read transistor, the polarization state corresponding to the stored data value of the memory cell. In some embodiments, the performing the write operation of the memory cell further includes turning off the write transistor in response to the write word line signal thereby electrically decoupling the write bit line and the gate of the read transistor from each other.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory cell, comprising:
a write bit line;
a write transistor coupled between the write bit line and a first node;
a read transistor coupled to the write transistor by the first node, wherein the read transistor includes a ferroelectric layer, a drain terminal of the read transistor coupled to a second node, and a source terminal of the read transistor coupled to a third node;
a first transistor coupled to the read transistor, the first transistor comprising:
a drain terminal of the first transistor coupled to the source terminal of the read transistor by the third node; and
a source terminal of the first transistor coupled to a read bit line; and
a second transistor coupled to the read transistor and the write transistor by the first node, the second transistor comprising:
a drain terminal of the second transistor coupled to a read word line;
a source terminal of the second transistor coupled to a fourth node; and
a gate terminal of the second transistor coupled to a source terminal of the write transistor and a gate terminal of the read transistor by the first node;
wherein the write transistor is configured to set a stored data value of the memory cell by a write bit line signal that adjusts a polarization state of the read transistor, the polarization state corresponding to the stored data value.

2. The memory cell of claim 1, wherein the write transistor comprises:
a drain terminal of the write transistor coupled to the write bit line;
the source terminal of the write transistor coupled to the first node and the read transistor; and
a gate terminal of the write transistor coupled to a write word line.

3. The memory cell of claim 2, wherein the read transistor further includes:
a gate terminal of the read transistor on the ferroelectric layer and being coupled to the source terminal of the write transistor by the first node.

4. The memory cell of claim 1, wherein
the drain terminal of the read transistor is coupled to a reference voltage supply by the second node; and
the first transistor further comprises: a gate terminal of the first transistor coupled to the read word line.

5. A memory cell, comprising:
a write bit line;
a write word line;
a write transistor of a first type, coupled to the write bit line, the write word line and a first node, the write transistor configured to be enabled or disabled in response to a write word line signal; and
a read transistor of the first type, the read transistor comprising:
a first gate terminal of the read transistor coupled to the write transistor by the first node; and
a ferroelectric layer having a polarization state that corresponds to a stored data value in the memory cell;
a first transistor coupled to the read transistor, the first transistor comprising:
a drain terminal of the first transistor coupled to a source terminal of the read transistor;
a source terminal of the first transistor coupled to a read bit line; and
a gate terminal of the first transistor coupled to a read word line; and
a second transistor coupled to the read transistor and the write transistor by the first node, the second transistor comprising:
a drain terminal of the second transistor coupled to the read word line;
a source terminal of the second transistor coupled to a second node; and
a gate terminal of the second transistor coupled to a source terminal of the write transistor and the first gate terminal of the read transistor by the first node;
wherein a drain terminal of the read transistor is coupled to a reference voltage supply;
wherein the write transistor is configured to set the stored data value in the memory cell by a write bit line signal that adjusts the polarization state of the ferroelectric layer.

6. The memory cell of claim 5, wherein
the write transistor includes an oxide channel region; and
the read transistor includes a silicon channel region.

7. The memory cell of claim 5, wherein
the write transistor includes an oxide channel region; and
the read transistor includes another oxide channel region.

8. The memory cell of claim 5, wherein the read transistor further comprises:
a gate insulating layer over a channel region of the read transistor;
a gate layer on the ferroelectric layer;
wherein the ferroelectric layer is between the gate insulating layer and the gate layer.

9. The memory cell of claim 5, wherein the ferroelectric layer includes a ferroelectric material including $HfO_2$, HfZrO, HfO or combinations thereof.

10. A method of operating a memory cell, the method comprising:
performing a write operation of the memory cell, the performing the write operation of the memory cell comprising:
setting a write bit line signal on a write bit line, the write bit line signal corresponding to a stored data value in the memory cell;
turning on a write transistor in response to a write word line signal thereby electrically coupling the write bit line to a gate of a read transistor;
setting the stored data value of the memory cell by adjusting a polarization state of the read transistor thereby turning on or off the read transistor, the polarization state corresponding to the stored data value of the memory cell; and
turning off the write transistor in response to the write word line signal thereby electrically decoupling the write bit line and the gate of the read transistor from each other; and
performing a read operation of the memory cell, the performing the read operation of the memory cell comprising:
pre-discharging a voltage of a read bit line to a first voltage or pre-charging the voltage of the read bit line to a second voltage different from the first voltage;
adjusting a voltage of a read word line from a third voltage to a fourth voltage;
sensing the voltage of the read bit line in response to adjusting the voltage of the read word line from the third voltage to the fourth voltage thereby outputting the stored data value in the memory cell; and
adjusting the voltage of the read word line from the fourth voltage to the third voltage.

11. The method of claim 10, wherein adjusting the voltage of the read word line from the third voltage to the fourth voltage comprises:
turning on a first transistor in response to a first control signal or the voltage of the read word line being the fourth voltage thereby electrically coupling the read bit line to a source of the read transistor.

12. The method of claim 10, wherein adjusting the voltage of the read word line from the fourth voltage to the third voltage comprises:
turning off a first transistor in response to a first control signal or the voltage of the read word line being the third voltage thereby electrically decoupling the read bit line and a source of the read transistor from each other.

13. The method of claim 10, wherein the stored data value of the memory cell has a first logical value corresponding to a first resistance state of the read transistor, or a second logical value corresponding to a second resistance state of the read transistor, the second logical value being opposite of the first logical value, the second resistance state being opposite of the first resistance state.

14. The memory cell of claim 1, wherein
the write transistor includes an oxide channel region; and
the read transistor includes a silicon channel region.

15. The memory cell of claim 1, wherein
the write transistor includes an oxide channel region; and
the read transistor includes another oxide channel region.

16. The memory cell of claim 1, wherein the read transistor further includes:
a channel region of the read transistor;
a gate insulating layer over the channel region of the read transistor;
a gate layer on the ferroelectric layer;
wherein the ferroelectric layer is between the gate insulating layer and the gate layer.

17. The memory cell of claim 16, wherein the read transistor further includes:
a metal layer over the gate insulating layer, wherein the metal layer is between the gate insulating layer and the ferroelectric layer.

18. The memory cell of claim 1, wherein the ferroelectric layer includes a ferroelectric material including $HfO_2$, HfZrO, HfO or combinations thereof.

19. The memory cell of claim 1, wherein the first transistor further comprises:
a gate terminal of the first transistor coupled to the drain terminal of the second transistor and the read word line.

20. The memory cell of claim 1, wherein the source terminal of the second transistor is electrically floating.

* * * * *